(12) United States Patent
Matsumoto

(10) Patent No.: US 9,595,421 B2
(45) Date of Patent: Mar. 14, 2017

(54) MULTI CHARGED PARTICLE BEAM WRITING METHOD, AND MULTI CHARGED PARTICLE BEAM WRITING APPARATUS

(71) Applicant: NuFlare Technology, Inc., Yokohama (JP)

(72) Inventor: Hiroshi Matsumoto, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 26 days.

(21) Appl. No.: 14/300,301

(22) Filed: Jun. 10, 2014

(65) Prior Publication Data

US 2014/0367584 A1    Dec. 18, 2014

(30) Foreign Application Priority Data

Jun. 13, 2013   (JP) ................. 2013-124437

(51) Int. Cl.
   *H01J 37/302*   (2006.01)
   *H01J 37/317*   (2006.01)
   *H01J 37/304*   (2006.01)

(52) U.S. Cl.
   CPC ........ *H01J 37/3177* (2013.01); *H01J 37/304* (2013.01); *H01J 37/3026* (2013.01); *H01J 37/302* (2013.01); *H01J 2237/31723* (2013.01); *H01J 2237/31764* (2013.01)

(58) Field of Classification Search
   CPC ... H01J 2237/31171; H01J 2237/31723; H01J 37/302; H01J 37/3177
   See application file for complete search history.

(56) References Cited

U.S. PATENT DOCUMENTS

| | | | |
|---|---|---|---|
| 6,759,666 B2 * | 7/2004 | Nagata ................ | H01J 37/3026 250/492.2 |
| 8,969,837 B2 * | 3/2015 | Matsumoto ......... | H01J 37/3177 250/396 R |
| 9,190,238 B2 * | 11/2015 | Matsumoto ......... | H01J 37/3007 |
| 9,202,673 B2 * | 12/2015 | Matsumoto ......... | H01J 37/3174 |
| 9,287,090 B2 * | 3/2016 | Yoshikawa ......... | H01J 37/3177 |

(Continued)

FOREIGN PATENT DOCUMENTS

JP    2014-112639 A    6/2014

*Primary Examiner* — Jack Berman
*Assistant Examiner* — James Choi
(74) *Attorney, Agent, or Firm* — Oblon, McClelland, Maier & Neustadt, L.L.P.

(57) ABSTRACT

A multi-beam writing method includes irradiating a target object with a multi-beam each being one of beams of irradiation time periods of a set of irradiation steps corresponding to writing processing concerned of plural writing processing of the multi-pass writing, for each writing processing of the multi-pass writing, using each set of irradiation steps, obtained by dividing entire irradiation steps of all the number of writing times of a beam concerned into a predetermined digit number irradiation steps to be set as an irradiation time obtained by multiplying a corresponding second gray scale by a quantization unit, as a set of irradiation steps of one of the plural writing processing of the multi-pass writing, wherein the corresponding second gray scale is one of plural second gray scales defined in decimals converted from each digit value of a binary number of a predetermined digit number.

8 Claims, 25 Drawing Sheets

(56) References Cited

U.S. PATENT DOCUMENTS

| | | | |
|---|---|---|---|
| 2012/0286170 A1* | 11/2012 | Van De Peut | B82Y 10/00 250/397 |
| 2013/0205264 A1* | 8/2013 | Fujimura | G03F 1/36 716/53 |
| 2014/0124684 A1* | 5/2014 | Matsumoto | H01J 37/3174 250/492.3 |
| 2015/0294836 A1* | 10/2015 | Inoue | H01J 37/3177 250/492.22 |

* cited by examiner

| k | tk |
|---|---|
| 0 | Δ |
| 1 | 2Δ |
| 2 | 4Δ |
| 3 | 8Δ |
| 4 | 16Δ |
| 5 | 32Δ |
| 6 | 64Δ |
| 7 | 128Δ |
| 8 | 256Δ |
| 9 | 512Δ |

FIG. 8

| Exposure Step Number | Exposure Time 1 | Exposure Time 2 | Maximum Value of Total Exposure Time |
|---|---|---|---|
| 1 | t0 = Δ | t9 = 512Δ | 513Δ |
| 2 | t1 = 2Δ | t8 = 256Δ | 258Δ |
| 3 | t2 = 4Δ | t7 = 128Δ | 132Δ |
| 4 | t3 = 8Δ | t6 = 64Δ | 72Δ |
| 5 | t4 = 16Δ | t5 = 32Δ | 48Δ |

FIG. 9

| Writing Pass Number | Exposure Step | Maximum Value of Total Exposure Time |
|---|---|---|
| 1 | 1-5 | 1023(Δ/4) |
| 2 | 1-5 | 1023(Δ/4) |
| 3 | 1-5 | 1023(Δ/4) |
| 4 | 1-5 | 1023(Δ/4) |

FIG. 10

| Writing Pass Number | Exposure Step | Maximum Value of Total Exposure Time |
|---|---|---|
| 1 | 1 | 513Δ |
| 2 | 2 | 258Δ |
| 3 | 3 | 132Δ |
| 4 | 4, 5 | 120Δ |

FIG. 11

| k | tk |
|---|---|
| 0 | Δ |
| 1 | 2Δ |
| 2 | 4Δ |
| 3 | 8Δ |
| 4 | 16Δ |
| 5 | 32Δ |
| 6 | 64Δ |
| 7 | 128Δ |
| 8a | 128Δ |
| 8b | 128Δ |
| 9a | 256Δ |
| 9b | 256Δ |

FIG. 14

| Exposure Step Number | Exposure Time 1 | Exposure Time 2 | Maximum Value of Total Exposure Time |
|---|---|---|---|
| 1 | t0 = Δ | t9b = 256Δ | 257Δ |
| 2 | t1 = 2Δ | t9a = 256Δ | 258Δ |
| 3 | t2 = 4Δ | t8b = 128Δ | 132Δ |
| 4 | t3 = 8Δ | t8a = 128Δ | 136Δ |
| 5 | t4 = 16Δ | t7 = 128Δ | 144Δ |
| 6 | t5 = 32Δ | t6 = 64Δ | 96Δ |

FIG. 15

| Writing Pass Number | Exposure Step | Maximum Value of Total Exposure Time |
|---|---|---|
| 1 | 1 | 257Δ |
| 2 | 2 | 258Δ |
| 3 | 3,4 | 268Δ |
| 4 | 5,6 | 210Δ |

FIG. 16

| Writing Pass Number | Stripe Shifting Amount (Y) | Exposure Step | Maximum Value of Total Exposure Time |
|---|---|---|---|
| 1 | 0 | 1 | 257Δ |
| 2 | 0 | 2 | 258Δ |
| 3 | 0 | 3,4 | 268Δ |
| 4 | 0 | 5,6 | 210Δ |
| 5 | W/4 | 1 | 257Δ |
| 6 | W/4 | 2 | 258Δ |
| 7 | W/4 | 3,4 | 268Δ |
| 8 | W/4 | 5,6 | 210Δ |
| 9 | W/2 | 1 | 257Δ |
| 10 | W/2 | 2 | 258Δ |
| 11 | W/2 | 3,4 | 268Δ |
| 12 | W/2 | 5,6 | 210Δ |
| 13 | 3W/4 | 1 | 257Δ |
| 14 | 3W/4 | 2 | 258Δ |
| 15 | 3W/4 | 3,4 | 268Δ |
| 16 | 3W/4 | 5,6 | 210Δ |

※W indicates Stripe Width.

FIG. 24

| Writing Pass Number | Stripe Shifting Amount (X, Y) | Exposure Step | Maximum Value of Total Exposure Time |
|---|---|---|---|
| 1 | (0, 0) | 1 | 257Δ |
| 2 | (0, 0) | 2 | 258Δ |
| 3 | (0, 0) | 3,4 | 268Δ |
| 4 | (0, 0) | 5,6 | 210Δ |
| 5 | (0, W/4+a/2) | 1 | 257Δ |
| 6 | (0, W/4+a/2) | 2 | 258Δ |
| 7 | (0, W/4+a/2) | 3,4 | 268Δ |
| 8 | (0, W/4+a/2) | 5,6 | 210Δ |
| 9 | (a/2, W/2) | 1 | 257Δ |
| 10 | (a/2, W/2) | 2 | 258Δ |
| 11 | (a/2, W/2) | 3,4 | 268Δ |
| 12 | (a/2, W/2) | 5,6 | 210Δ |
| 13 | (a/2, 3W/4+a/2) | 1 | 257Δ |
| 14 | (a/2, 3W/4+a/2) | 2 | 258Δ |
| 15 | (a/2, 3W/4+a/2) | 3,4 | 268Δ |
| 16 | (a/2, 3W/4+a/2) | 5,6 | 210Δ |

※W indicates Stripe Width. "a" indicates beam size.

FIG. 25

MULTI CHARGED PARTICLE BEAM WRITING METHOD, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2013-124437 filed on Jun. 13, 2013 in Japan, the entire contents of which are incorporated herein by reference.

BACKGROUND OF THE INVENTION

Field of the Invention

The present invention relates to a multi charged particle beam writing method and a multi charged particle beam writing apparatus. More specifically, for example, the present invention relates to a multi-pass writing method in writing with multiple beams.

Description of Related Art

The lithography technique that advances miniaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with electron beams.

As an example employing the electron beam writing technique, a writing apparatus using multiple beams (multi-beams) can be cited. Compared with the case of writing a pattern by using a single electron beam, since it is possible to emit multiple beams at a time in multiple writing, the throughput can be greatly increased. In the writing apparatus employing a multi-beam system, for example, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample" (refer to, e.g., Japanese Patent Application Laid-open (JP-A) No. 2006-261342).

In the multi-beam writing, the dose of an individual beam is individually controlled by an irradiation time. For highly accurately controlling the dose of each beam, it is necessary to carry out blanking control at high speed to perform a beam ON/OFF control. Conventionally, in a writing apparatus of a multi-beam system, a blanking control circuit for each beam is placed on a blanking plate where each blanking electrode of multiple beams is arranged. Controlling is asynchronously performed for each beam. For example, a trigger signal for causing a beam to be ON is sent to control circuits of all the beams. In responsive to the trigger signal, the control circuit of each beam applies a beam-on voltage to an electrode and, simultaneously, starts counting the irradiation time period by a counter. Then, when the irradiation time has been completed, a beam-off voltage is applied. In performing such a control, a 10-bit control signal has been used, for example. However, since the space for placing a circuit on a blanking plate and the amount of current to be used are restricted, there is no other alternative but to have an uncomplicated circuit for the amount of information of control signals. Therefore, it has been difficult to build in a blanking circuit that can perform an operation of high speed and high precision. Further, installing a blanking control circuit for each beam on a blanking plate restricts to narrow the pitch of multiple beams. By contrast, when placing a control circuit for each beam outside the writing apparatus body and connecting each of them by wiring in order to secure a space for installing the circuit, since the wiring becomes long, there is a problem that a crosstalk problem becomes more prominent.

BRIEF SUMMARY OF THE INVENTION

In accordance with one aspect of the present invention, a multi charged particle beam writing method includes converting a first gray scale value into a binary number of a predetermined digit number set in advance, wherein the first gray scale value is obtained by dividing a total irradiation time of all a number of times of writing of one corresponding beam of multiple charged particle beams or a plurality of corresponding beams of the multiple charged particle beams which irradiate a same position of a target object by a quantization unit when performing multi-pass writing using the multiple charged particle beams formed from a charged particle beam; and irradiating the target object with the multiple charged particle beams each respectively being one of beams of irradiation time periods of a set of irradiation steps corresponding to writing processing concerned of a plurality of writing processing of the multi-pass writing, for each writing processing of the multi-pass writing, using each set of irradiation steps as a set of irradiation steps of one of the plurality of writing processing of the multi-pass writing, where the each set of irradiation steps is obtained by dividing entire irradiation steps of all a number of times of writing of a beam concerned into a predetermined digit number irradiation steps to be respectively set as an irradiation time obtained by multiplying a corresponding second gray scale value by a quantization unit, wherein the corresponding second gray scale value is one of a plurality of second gray scale values defined in decimal numbers converted from each digit value of a binary number of the predetermined digit number, or the each set of irradiation steps is obtained by further dividing a part of the predetermined digit number irradiation steps in order to obtain a plurality of irradiation steps more than the predetermined digit number irradiation steps.

In accordance with another aspect of the present invention, a multi charged particle beam writing method includes converting a first gray scale value into a binary number of a predetermined digit number set in advance, wherein the first gray scale value is calculated by dividing an irradiation time, which is obtained by assigning a total irradiation time of all a number of times of writing of one corresponding beam of multiple charged particle beams or a plurality of corresponding beams of the multiple charged particle beams which irradiate a same position of a target object to each of a plurality of first writing processing, by a quantization unit when performing multi-pass writing which combines the plurality of first writing processing of writing while shifting a position of a beam deflection region and a plurality of second writing processing of writing without shifting the position of the beam deflection region for each of the plurality of first writing processing, using the multiple beams formed from a charged particle beam; and irradiating the target object with the multiple beams each respectively being one of beams of irradiation time periods of a set of irradiation steps corresponding to writing processing concerned, for each first writing processing of the plurality of first writing processing and for each second writing processing of the plurality of second writing processing of the multi-pass writing, using each set of irradiation steps as a set of irradiation steps of one of the plurality of second writing processing, where the each set of irradiation steps is obtained by dividing entire irradiation steps of the plurality of second writing processing of a beam concerned into predetermined digit number irradiation steps to be respectively set as an irradiation time obtained by multiplying a corresponding second gray scale value by a quantization unit, wherein the corresponding second gray scale value is one of a plurality of second gray scale values defined in decimal numbers converted from each digit value of a binary number of the predetermined digit number, or the each set of irradiation steps is obtained by further dividing a part of the predetermined digit number irradiation steps in order to obtain a plurality of irradiation steps more than the predetermined digit number irradiation steps.

Moreover, in accordance with another aspect of the present invention, a multi charged particle beam writing apparatus includes: a stage configured to mount a target object thereon and to be continuously movable; an emission unit configured to emit a charged particle beam; an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings; a plurality of blankers configured to respectively perform blanking deflection of a corresponding beam in the multiple beams having passed through the plurality of openings of the aperture member; a blanking aperture member configured to block each beam having been deflected to be in a beam-off state by the plurality of blankers; a conversion unit configured to convert a first gray scale value into a binary number of a predetermined digit number set in advance, wherein the first gray scale value is obtained by dividing a total irradiation time of all a number of times of writing of at least one corresponding beam of the multiple beams which irradiates a same position of the target object by a quantization unit when performing multi-pass writing using the multiple beams; and a deflection control unit configured to control a corresponding blanker of the plurality of blankers so that the target object is irradiated with the multiple beams each being one of beams of irradiation time periods of a set of irradiation steps corresponding to writing processing concerned of a plurality of writing processing of the multi-pass writing, for each writing processing of the multi-pass writing, using each set of irradiation steps as a set of irradiation steps of one of the plurality of writing processing of the multi-pass writing, where the each set of irradiation steps is obtained by dividing entire irradiation steps of all a number of times of writing of a beam concerned into predetermined digit number irradiation steps to be respectively set as an irradiation time obtained by multiplying a corresponding second gray scale value by a quantization unit, wherein the corresponding second gray scale value is one of a plurality of second gray scale values defined in decimal numbers converted from each digit value of a binary number of the predetermined digit number, or the each set of irradiation steps is obtained by further dividing a part of the predetermined digit number irradiation steps in order to obtain a plurality of irradiation steps more than the predetermined digit number irradiation steps.

BRIEF DESCRIPTION OF THE DRAWINGS

FIG. 8 shows a bit processing table representing a relation between each digit number and an irradiation time of each digit in the case of the digit number n=10 according to the first embodiment;

FIG. 9 shows a grouped exposure table according to a comparative example of the first embodiment;

FIG. 10 shows an example of a writing pass table according to a comparative example of the first embodiment;

FIG. 11 shows an example of a writing pass table according to the first embodiment;

FIG. 14 shows another example of a bit processing table representing a relation between each digit number and an irradiation time of each digit, after dividing a digit number n=10 according to the first embodiment;

FIG. 15 shows another example of a grouped exposure table according to the first embodiment;

FIG. 16 shows another example of a writing pass table according to the first embodiment;

FIG. 24 shows an example of a writing pass table in the case of multi-pass writing, where position shifting is performed only in the y direction according to the second embodiment;

FIG. 25 shows another example of a writing pass table in the case of multi-pass writing, where position shifting is performed only in the y direction according to the second embodiment;

DETAILED DESCRIPTION OF THE INVENTION

An irradiation method has been examined in which irradiation of each beam's shot of multiple beams is divided into a plurality of irradiation steps obtained by converting an irradiation time of each beam's shot of multiple beams into binary numbers, defining a binary number of each digit in a decimal number to be equivalent to an irradiation time of each digit, and combining the irradiation time of each digit to be digit number irradiation steps.

On the other hand, in writing with multiple beams, multi-pass writing that divides a required dose into a plurality of times of writing (exposure) is performed in order to suppress the influence of a resist heating etc. In the multi-pass writing, writing is repeated per stripe unit or substrate unit. When performing exposure of "n" irradiation steps, since the number of passes (the number of times of writing processing) of the multi-pass writing is increased, there is a problem in that the amount of data transmission and the number of irradiation steps are also increased. Therefore, a further improvement is needed.

Then, in the following Embodiments, there will be described a writing apparatus and method that can reduce the amount of data transmission and the number of irradiation steps in multi-pass writing while maintaining restriction of a circuit installation space and increasing the precision of dose control.

In the following embodiments, there will be described a configuration in which an electron beam is used as an example of a charged particle beam. The charged particle beam is not limited to the electron beam, and other charged particle beam such as an ion beam may also be used.

First Embodiment

Figure 1:
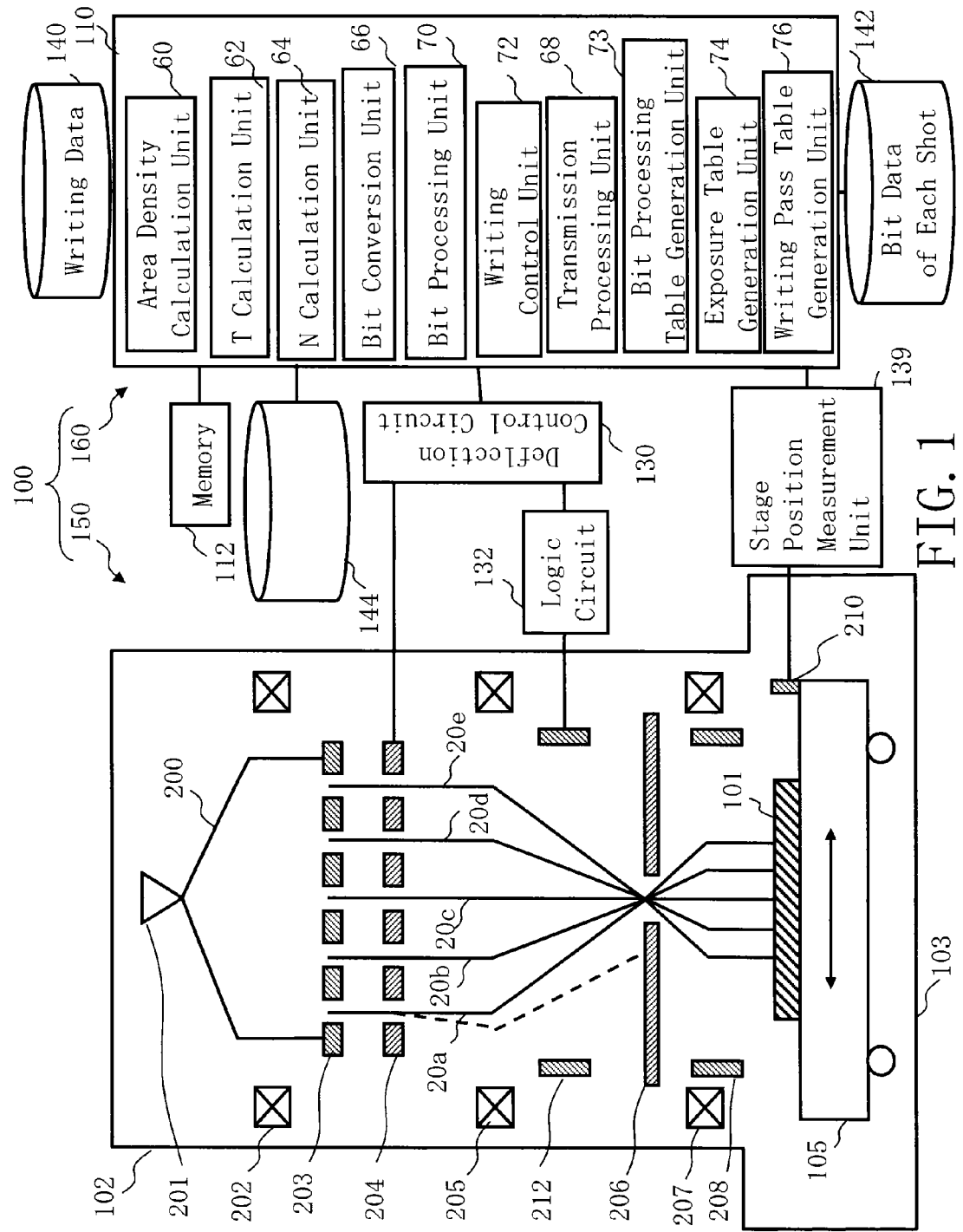
FIG. 1 is a schematic diagram showing a configuration of a writing apparatus according to the first embodiment.

FIG. 1 is a schematic diagram showing a configuration of a writing apparatus according to the first embodiment. In FIG. 1, a writing (or "drawing") apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a deflector 212, a limiting aperture member 206, an objective lens 207, and a deflector 208. In the writing chamber 103, there is arranged an XY stage 105. On the XY stage 105, there is placed a target object or "sample" 101 such as a mask serving as a writing target substrate when performing writing. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. On the XY stage 105, further, there is arranged a mirror 210 for measuring the position of the XY stage.

The control unit 160 includes a control computer 110, a memory 112, a deflection control circuit 130, a logic circuit 132, a stage position measurement unit 139, and storage devices 140, 142, and 144, such as magnetic disk drives. The control computer 110, the memory 112, the deflection control circuit 130, the stage position measurement unit 139, and the storage devices 140, 142, and 144 are mutually connected through a bus (not shown). Writing data is input into the storage device 140 (storage unit) from the outside to be stored therein.

In the control computer 110, there are arranged an area density calculation unit 60, an irradiation time calculation unit 62, a gray scale value calculation unit 64, a bit conversion unit 66, a bit processing unit 70, a writing control unit 72, a bit processing table generation unit 73, an exposure table generation unit 74, a writing pass table generation unit 76, and a transmission processing unit 68. Each function of them may be configured by hardware such as an electronic circuit, or by software such as a program implementing these functions. Alternatively, they may be configured by a combination of hardware and software. Data which is input and output to/from the area density calculation unit 60, the irradiation time calculation unit 62, the gray scale value calculation unit 64, the bit conversion unit 66, the bit processing unit 70, the writing control unit 72, the bit processing table generation unit 73, the exposure table generation unit 74, the writing pass table generation unit 76, or the transmission processing unit 68, and data being calculated are stored in the memory 112 each time.

FIG. 1 shows a structure necessary for explaining the first embodiment. Other structure elements generally necessary for the writing apparatus 100 may also be included.

Figure 2A:
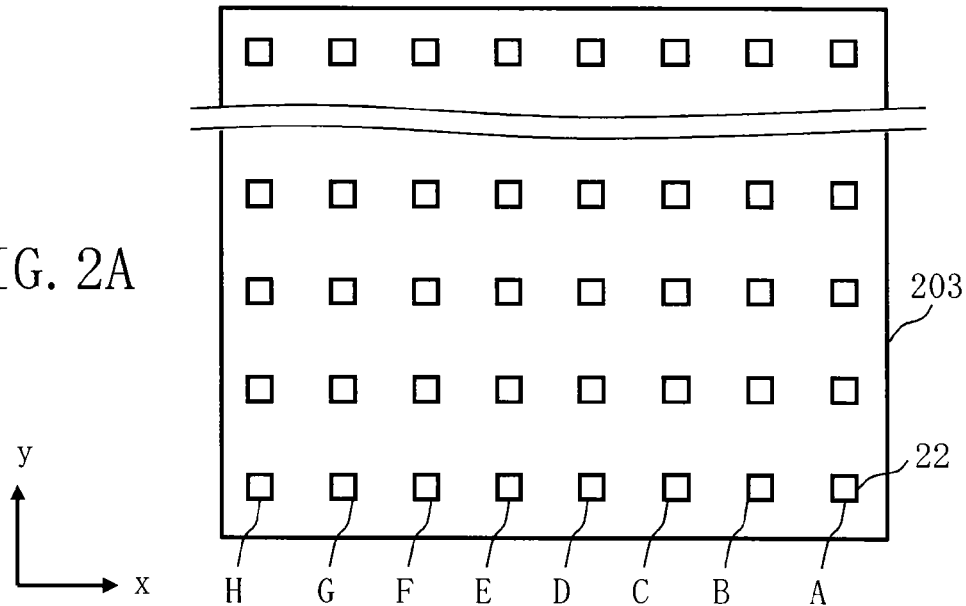
FIGS. 2A and 2B are conceptual diagrams each showing an example of the configuration of an aperture member according to the first embodiment.
Figure 2B:
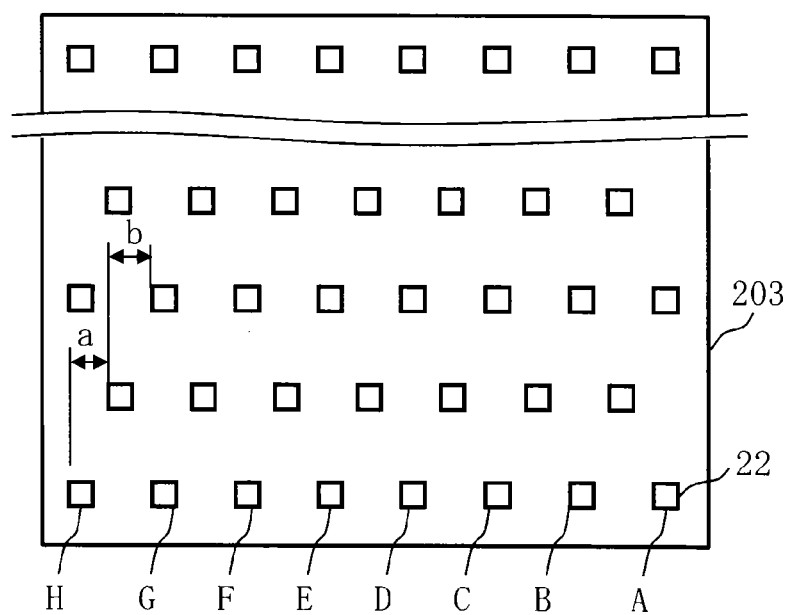

FIGS. 2A and 2B are conceptual diagrams each showing an example of the configuration of an aperture member according to the first embodiment. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. Each hole 22 is a quadrangle of the same dimensions and shape. Alternatively, each hole may be a circle of the same circumference. In this case, there is shown an example of each row having eight holes 22 from A to H in the x direction. Multi-beams 20 are formed by letting portions of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
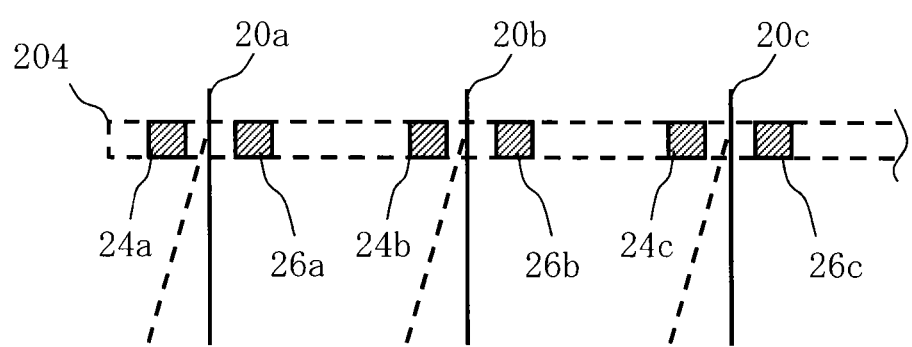
FIG. 3 is a conceptual diagram showing the configuration of a blanking plate according to the first embodiment.
Figure 4:
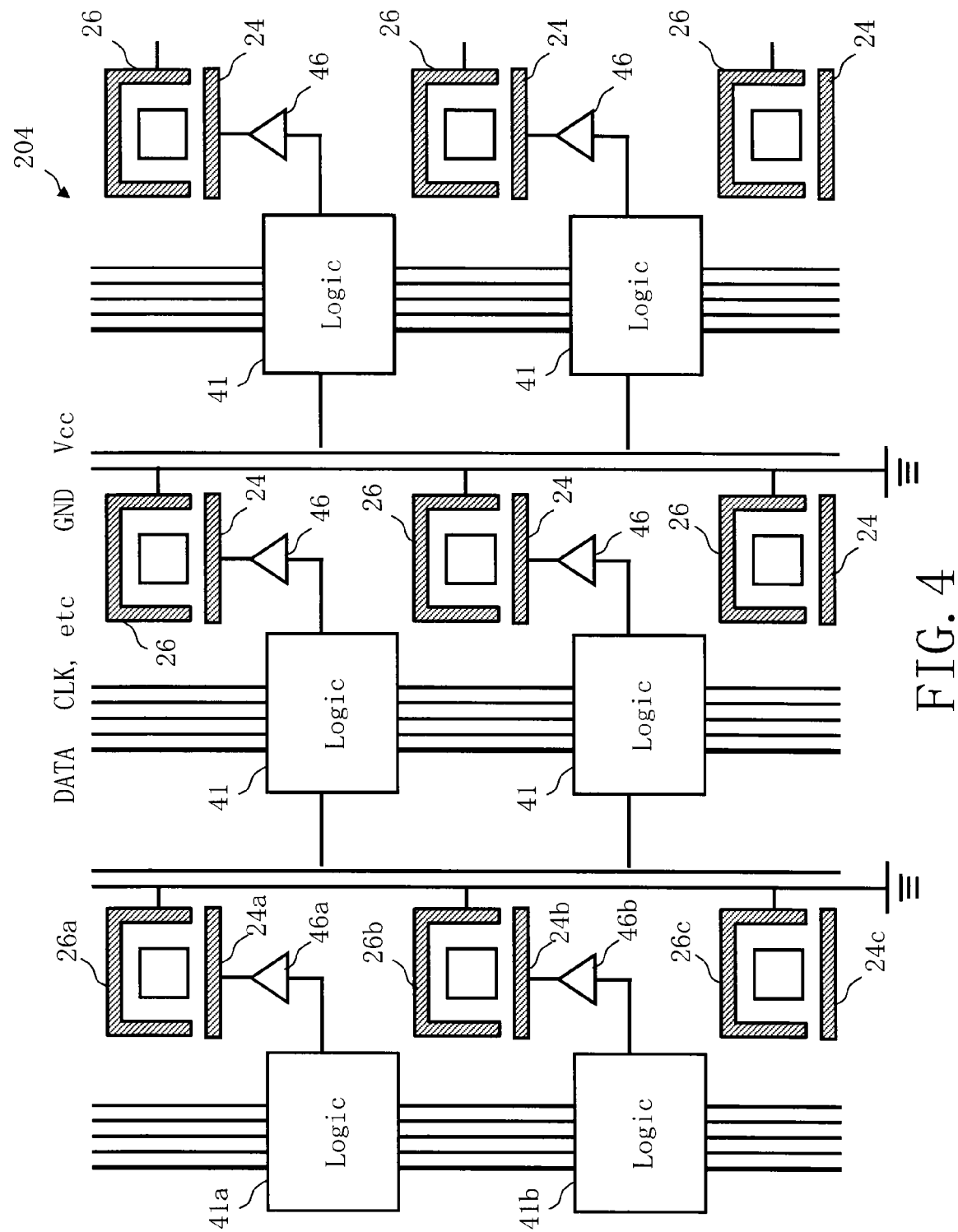
FIG. 4 is a top view conceptual diagram showing the configuration of a blanking plate according to the first embodiment.

FIG. 3 is a conceptual diagram showing the configuration of a blanking plate according to the first embodiment. FIG. 4 is a top view conceptual diagram showing the configuration of a blanking plate according to the first embodiment. In the blanking plate 204, a passage hole is formed to be corresponding to the arrangement position of each hole 22 of the aperture member 203, and a pair of electrodes 24 and 26 (blanker: blanking deflector) is arranged for each passage hole. An amplifier 46 for applying voltage is respectively arranged at one (for example, the electrode 24) of the two electrodes 24 and 26 for each beam. A logic circuit 41 is independently arranged at the amplifier 46 for each beam respectively. The other one (for example, the electrode 26) of the two electrodes 24 and 26 for each beam is grounded. An electron beam 20 passing through a corresponding passage hole is respectively deflected by the voltage applied to the two electrodes 24 and 26 being a pair. Blanking control is performed by this deflection. Thus, a plurality of blankers respectively perform blanking deflection of a corresponding beam in the multiple beams having passed through a plurality of holes 22 (openings) of the aperture member 203.

Figure 5:
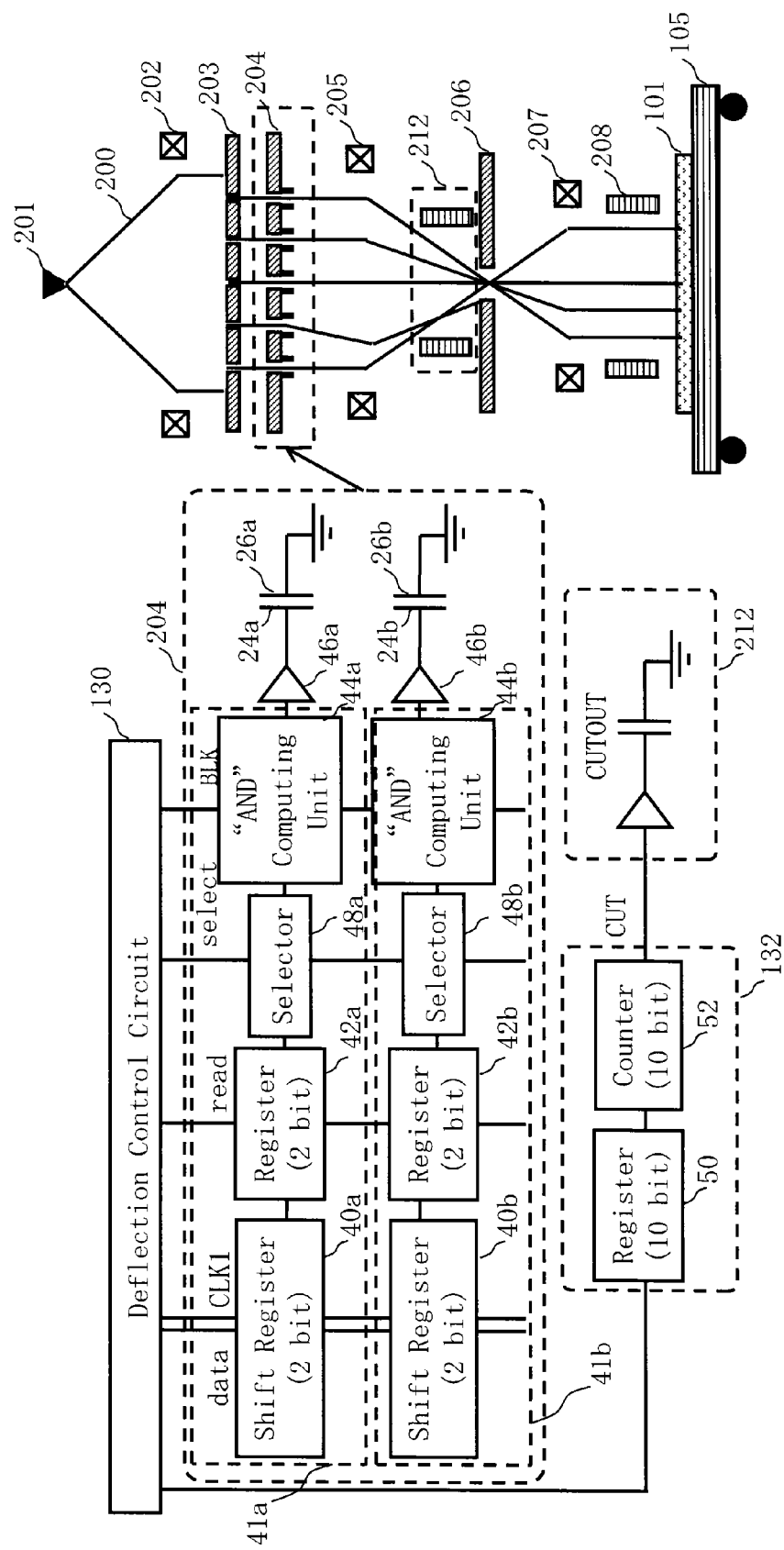
FIG. 5 is a schematic diagram showing the internal configuration off an individual blanking control circuit and a common blanking control circuit according to the first embodiment.

FIG. 5 is a schematic diagram showing the internal configuration of an individual blanking control circuit and a common blanking control circuit according to the first embodiment. In FIG. 5, a shift register 40, a register 42, a selector 48, and an AND computing unit 44 (logical product computing unit) are arranged in each logic circuit 41 for individual blanking control arranged at the blanking plate 204 in the body of the writing apparatus 100. The AND computing unit 44 may be omitted. According to the first embodiment, for example, a 2-bit control signal is used for individual blanking control for each beam, which has conventionally been controlled by, for example, a 10-bit control signal. That is, for example, a 2-bit control signal is input/output to/from the shift register 40, the register 42, the selector 48 and the AND computing unit 44. Since the amount of information of a control signal is small, an installation area of the control circuit can be small. In other words, even when a logic circuit is arranged on the blanking plate 204 whose installation space is small, more beams can be arranged at a smaller beam pitch. This enables the amount of current passing the blanking plate to be increased, and therefore, a writing throughput can be improved.

Moreover, an amplifier is arranged at the deflector 212 for common blanking, and a register 50 and a counter 52 are arranged at the logic circuit 132. These do not perform several different controlling at the same time, and therefore, it is sufficient to use one circuit to perform ON/OFF control. Accordingly, even when arranging a circuit for a high speed response, no problem occurs with respect to the restriction on the installation space and the current to be used in the circuit. Therefore, this amplifier is operated at very high speed compared with an amplifier realizable on a blanking aperture. This amplifier is controlled by a 10-bit control signal, for example. That is, for example, a 10-bit control signal is input/output to/from the register 50 and the counter 52.

According to the first embodiment, blanking control of each beam is performed by using both the beam ON/OFF control by each logic circuit 41 for individual blanking control described above and the beam ON/OFF control by the logic circuit 132 for common blanking control that collectively control all the multiple beams.

Figure 6:
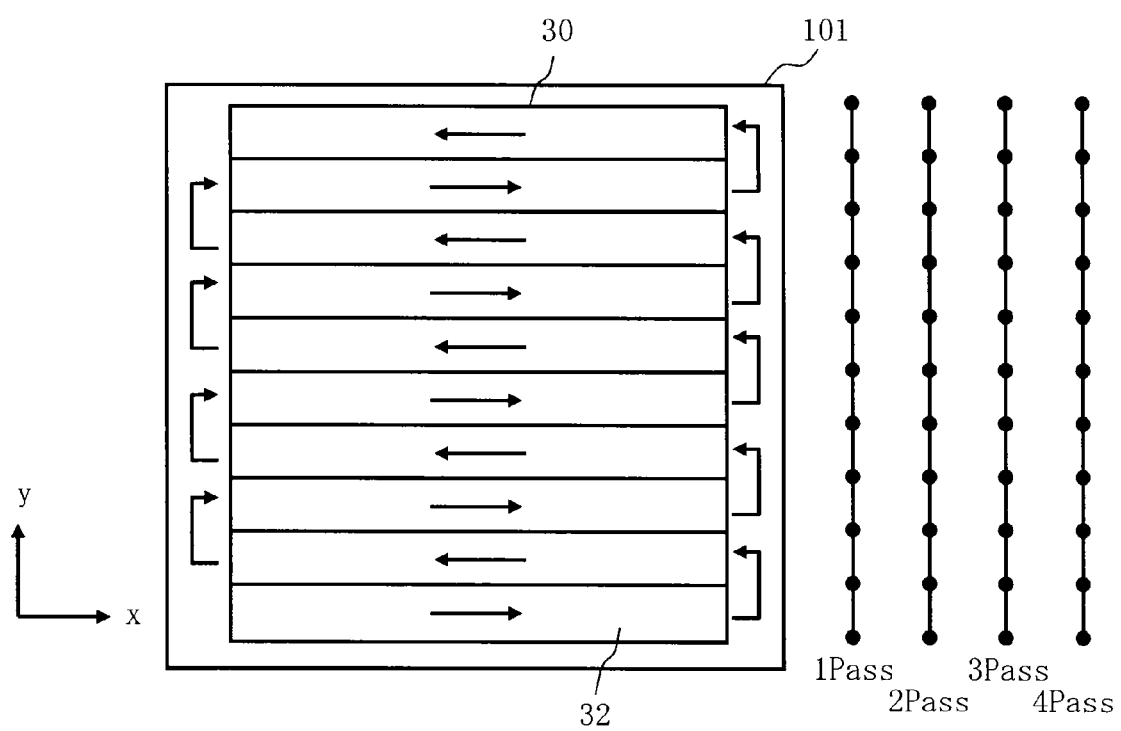
FIG. 6 is a schematic diagram describing an example of a writing operation according to the first embodiment.

FIG. 6 is a conceptual diagram explaining an example of a writing operation according to the first embodiment. As shown in FIG. 6, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region to be irradiated with one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32 of the first pass (the first writing processing) of the multi-pass writing, it again returns to the left end of the first stripe region 32, and the first stripe region 32 of the second pass (the second writing processing) of the multi-pass writing is written. Similarly, writing of the first stripe region 32 is repeated several times equal to the number of passes of the multi-pass writing. After writing the first stripe regions 32 of all the passes, the stage position is moved in the −y direction and adjusted such that the irradiation region is located at the right end of the second stripe region 32 or at a position more right than the right end to be relatively located in the y direction. Then, similarly, writing advances in the −x direction by moving the XY stage 105 in the x direction, for example. After writing the second stripe region 32 of the first pass (the first writing processing) of the multi-pass writing, it again returns to the right end of the second stripe region 32, and the second stripe region 32 of the second pass (the second writing processing) of the multi-pass writing is written. Similarly, writing of the second stripe region 32 is repeated several times equal to the number of passes of the multi-pass writing. After writing the second stripe regions 32 of all the passes, the stage position is moved in the −y direction and adjusted such that the irradiation region is located at the left end of the third stripe region 32 or at a position more left than the left end to be relatively located in the y direction. Then, similarly, writing of the third stripe region 32 is performed in the x direction by moving the XY stage 105 in the −x direction, for example. Writing of the third stripe region 32 is repeated several times equal to the number of passes of the multi-pass writing. After writing the third stripe regions 32 of all the passes, writing is performed in the −x direction in the fourth stripe region 32. That is, writing is performed while alternately changing the direction, and thus, the writing time can be shortened. However, the writing operation is not limited to the case of performing writing while alternately changing the direction, and it is also acceptable to perform writing in the same direction when writing each stripe region 32. By one shot, a plurality of shot patterns 36 of the same number as the holes 22 are formed at a time by multiple beams which have been formed by passing through respective corresponding holes 22 of the aperture member 203.

Although, in FIG. 6, the example of the multi-pass writing which repeats writing processing per stripe region 32 unit has been described, it is not limited thereto. It is also preferable in the multi-pass writing to repeat the writing processing per target object 101 (substrate) unit. Alternatively, it is also preferable in the multi-pass writing to repeat writing processing per predetermined region unit in the stripe region 32. As a predetermined region, a region, obtained by dividing the inside of the stripe region 32, to have a width in the x direction to be irradiated by multiple beams of one time irradiation may also be used, for example.

Figure 7:
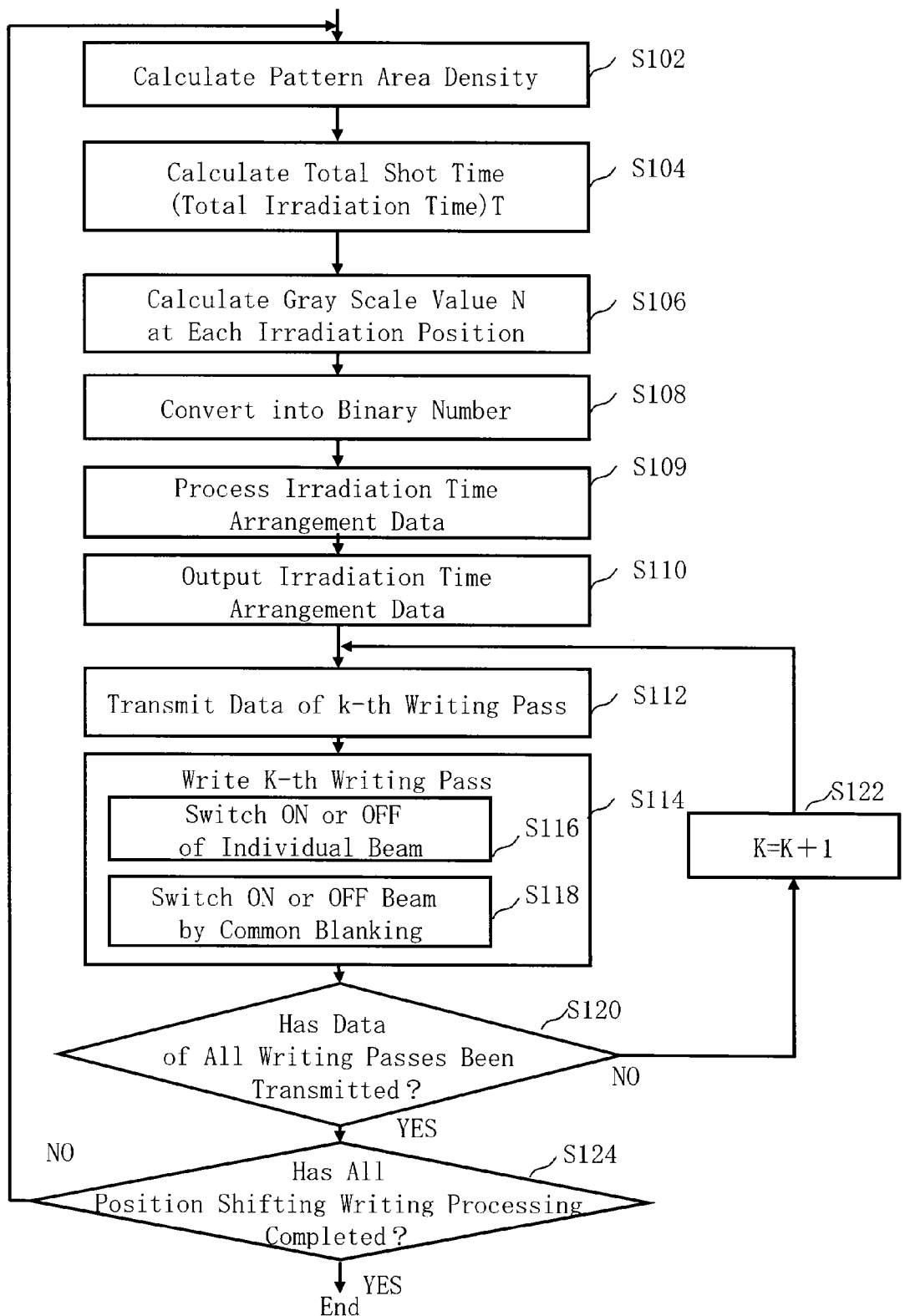
FIG. 7 is a flowchart showing main steps of a writing method according to the first embodiment.

FIG. 7 is a flowchart showing main steps of a writing method according to the first embodiment. In FIG. 7, a series of steps: a pattern area density calculation step (S102), a total shot time (total irradiation time) T calculation step (S104), a gray scale value N calculation step (S106), a conversion to binary number step (S108), an irradiation time arrangement data processing step (S109), an irradiation time arrangement data output step (S110), a target writing pass data transmission step (S112), a target writing pass writing step (S114), a determination step (S120), and a writing pass change step (S122) are executed. The target writing pass writing step (S114) executes, as its internal steps, a series of steps: an individual beam ON/OFF switching step (S116) and a common beam ON/OFF switching step (S118). According to the first embodiment, the determination step (S124) may be omitted. The determination step (S124) will be explained in the second Embodiment.

In the pattern area density calculation step (S102), the area density calculation unit 60 reads writing data from the storage device 140, and calculates the area density of a pattern arranged in the writing region of the target object 101 or in each mesh region of a plurality of mesh regions made by virtually dividing a chip region to be written into meshes. For example, the writing region of the target object 101 or a chip region to be written is divided into strip-shaped stripe regions each having a predetermined width. Then, each stripe region is virtually divided into a plurality of mesh regions described above. It is preferable that the size of a mesh region is, for example, a beam size, or smaller than a beam size. For example, the size of a mesh region is preferably about 10 nm. The area density calculation unit 60 reads corresponding writing data from the storage device 140 for each stripe region, and allocates a plurality of figure patterns defined in the writing data to a mesh region, for example. Then, the area density of a figure pattern arranged in each mesh region is to be calculated.

In the total shot time (total irradiation time) T calculation step (S104), the irradiation time calculation unit 62 calculates a total irradiation time T (which hereinafter will also be called a shot time period or an exposure time) of all the passes (the total number of times of writing) of corresponding beams which irradiate the same position of the target object 101 when performing multi-pass writing using multiple beams of electron beams for each mesh region of a predetermined size. The corresponding beam may be a specific one of the multiple beams or plural ones of them. In the case of plural ones, a plurality of beams each expose the same point on the target object at different time. It is preferable to obtain a total irradiation time T, being a reference, to be in proportion to the area density of a calculated pattern. Moreover, it is preferable that the total irradiation time T to be finally calculated is a time equivalent to a dose after correction, that is a dose having been corrected with respect to a dimension change amount for a phenomenon causing dimension variations, such as a proximity effect, a fogging effect, or a loading effect not shown. The size of a plurality of mesh regions for defining the total irradiation time T and the size of a plurality of mesh regions where a pattern area density is defined may be the same size or different sizes. When they are different sizes, each total irradiation time T is calculated after interpolating an area density by linear interpolation, etc. The total irradiation time T for each mesh region is defined in a total irradiation time map, and the total irradiation time map is stored in the storage device 142, for example.

In the gray scale value N calculation step (S106), the gray scale value calculation unit 64 calculates a gray scale value N, being an integer, which is used when defining the total irradiation time T for each mesh region, defined in the total irradiation time map, by using a predetermined quantization unit $\Delta$. The total irradiation time T is defined by the following equation (1).

$$T = \Delta N \tag{1}$$

Therefore, the gray scale value N is defined as an integer value obtained by dividing the total irradiation time T by a quantization unit $\Delta$. The quantization unit $\Delta$ can be variously set, and, for example, can be defined by 1 ns (nanosecond), etc. It is preferable that a value of 1 to 10 ns, for example, is used as the quantization unit $\Delta$. $\Delta$ indicates a quantization unit for controlling, such as a clock period, in the case of performing control by a counter.

In the conversion to binary number step (S108), the bit conversion unit 66 converts, for each shot position of multiple beams, a gray scale value N (first gray scale value) of each beam of the multiple beams, which is obtained by dividing, by the quantization unit $\Delta$, a total irradiation time of the total number of times of writing of corresponding beams each irradiating the same position of the target object 101 when performing multi-pass writing using multiple beams into a binary value (respective data of binary numbers) of n-digit set in advance. For example, when N=50, since it is $50=2^1+2^4+2^5$, if converting into a 10-digit binary value, it becomes "0000110010". For example, if N=500, it is "0111110100". For example, if N=700, it is "1010111100". For example, if N=1023, it is "1111111111". Thereby, the total irradiation time T is defined by the following equation (2).

$$T = \Delta \sum_{k=0}^{n-1} a_k 2^k \tag{2}$$

$a_k$ indicates a value (1 or 0) of each digit in the case defining the gray scale value N by a binary number. Although it is sufficient for n, being the number of digits, to be a plurality of, preferably it should be four or more digits, and more preferably, it should be eight or more digits.

According to the first embodiment, the entire irradiation steps of the total number of times of writing of a beam concerned is divided or "re-allocated" into "n" irradiation steps, "n" being the number of digits of a binary number sequence (data of binary numbers) set in advance, where the irradiation time period of each digit is obtained by defining a decimal number converted from a binary number of a corresponding digit of the n-digit binary number so as to be a gray scale value, and multiplying the gray scale value by $\Delta$. In other words, the entire irradiation steps of all the passes in multi-pass writing is divided into a plurality of irradiation steps of irradiation time periods of $\Delta a_0 2^0$, $\Delta a_1 2^1$, ..., $\Delta a_k 2^k$, ..., $\Delta a_{n-1} 2^{n-1}$. In the case of n=10, n being the number of digits, the entire irradiation steps of all the passes is divided into ten irradiation steps.

FIG. 8 shows a bit processing table representing a relation between each digit number and an irradiation time of each digit in the case of the digit number n=10 according to the first embodiment. In FIG. 8, the irradiation time of the first digit (k=0) (the first bit) is $\Delta$, the irradiation time of the second digit (k=1) (the second bit) is $2\Delta$, the irradiation time of the third digit (k=2) (the third bit) is $4\Delta$, the irradiation time of the fourth digit (k=3) (the fourth bit) is 8Δ, . . . , and the irradiation time of the tenth digit (k=9) (the tenth bit) is 512Δ.

For example, in the case of the digit number n being 10 (n=10), if N=700, the irradiation time of the tenth digit (the tenth bit) is Δ×512. The irradiation time of the ninth digit (the ninth bit) is Δ×0=0. The irradiation time of the eighth digit (the eighth bit) is Δ×128. The irradiation time of the seventh digit (the seventh bit) is Δ×0=0. The irradiation time of the sixth digit (the sixth bit) is Δ×32. The irradiation time of the fifth digit (the fifth bit) is Δ×16. The irradiation time of the fourth digit (the fourth bit) is Δ×8. The irradiation time of the third digit (the third bit) is Δ×4. The irradiation time of the second digit (the second bit) is Δ×0=0. The irradiation time of the first digit (the first bit) is Δ×0=0. The total time of these is 700Δ.

For example, in the case of performing irradiation in order from the largest digit to the smallest digit, if Δ=1 ns, the first irradiation step is irradiation of 512 ns (beam ON). The second irradiation step is irradiation of 0 ns (beam OFF). The third irradiation step is irradiation of 128 ns (beam ON). The fourth irradiation step is irradiation of 0 ns (beam OFF). The fifth irradiation step is irradiation of 32 ns (beam ON). The sixth irradiation step is irradiation of 16 ns (beam ON). The seventh irradiation step is irradiation of 8 ns (beam ON). The eighth irradiation step is irradiation of 4 ns (beam ON). The ninth irradiation step is irradiation of 0 ns (beam OFF). The tenth irradiation step is irradiation of 0 ns (beam OFF).

According to the first embodiment, "n" irradiation steps are respectively allotted to any one of passes of a preset number.

FIG. 9 shows an example of a grouped exposure table according to the first embodiment. FIG. 9 shows the case of n=10 similarly to FIG. 8. In the example of FIG. 9, in order that the difference between the totals of grouped irradiation time may become smaller to be close to uniform, configuration is performed as follows. As the exposure step 1, the group 1 is composed of the first digit (k=0) (the first bit) and the tenth digit (k=9) (the tenth bit) of the bit processing table of FIG. 8. As the exposure step 2, the group 2 is composed of the second digit (k=1) (the second bit) and the ninth digit (k=8) (the ninth bit). As the exposure step 3, the group 3 is composed of the third digit (k=2) (the third bit) and the eighth digit (k=7) (the eighth bit). As the exposure step 4, the group 4 is composed of the fourth digit (k=3) (the fourth bit) and the seventh digit (k=6) (the seventh bit). As the exposure step 5, the group 5 is composed of the fifth digit (k=4) (the fifth bit) and the sixth digit (k=5) (the sixth bit).

FIG. 10 shows an example of a writing pass table according to a comparative example of the first embodiment. FIG. 10 shows the case of n=10 similarly to FIGS. 8 and 9. In FIG. 10, there is shown the case of, not dividing all the passes of multi-pass writing, but dividing an irradiation time period of each pass into "n" irradiation steps shown in FIG. 8 and performing grouping shown in FIG. 9 for them. In the comparative example of FIG. 10, "n" irradiation steps, that is exposure steps 1 to 5, are performed each time for each pass of multi-pass writing. Therefore, the number of irradiation steps and the amount of data transmission of each irradiation step of the irradiation steps are increased in accordance with the number of passes.

FIG. 11 shows an example of a writing pass table according to the first embodiment. In FIG. 11, the case of n=10 is shown similarly to FIGS. 8 and 9. In the first embodiment, since the irradiation time of all the passes of multi-pass writing is divided into "n" irradiation steps shown in FIG. 8, what is necessary is just to allot each exposure step shown in FIG. 9 to one of writing passes of multi-pass writing. In the example of FIG. 11, as the writing pass 1 being the first pass (the first writing processing), each digit of the exposure step 1 is assigned. As the writing pass 2 being the second pass (the second writing processing), each digit of the exposure step 2 is assigned. As the writing pass 3 being the third pass (the third writing processing), each digit of the exposure step 3 is assigned. As the writing pass 4 being the fourth pass (the fourth writing processing), each digit of the exposure steps 4 and 5 is assigned. Thereby, even if the number of passes (multiplicity) in multi-pass writing is increased, it is possible to prevent the increase in the number of irradiation steps and the amount of data transmission of each irradiation step which are caused by the pass number increase. According to the first embodiment, the numbers of irradiation steps performed in one writing processing and in other, at least one other, writing processing of multi-pass writing may be different from each other. In the writing pass table of FIG. 11, the amount of data transmission and the clock of the shift register used for data transmission can be one fourth when compared with the comparative example shown in FIG. 10.

Here, as shown in FIG. 11, the total irradiation time of the writing pass shown by the writing pass 1 is 513Δ, whereas the total irradiation time of the writing pass shown by the writing pass 4 is 120Δ. Thus, there is a difference of four or more times between totals of exposure time (irradiation time) of writing passes. With respect to a writing pass of a short exposure time (irradiation time), compared with a writing pass of a long exposure time (irradiation time), when performing writing with continuously moving the stage, it is necessary to increase the stage speed or keep the same stage speed while establishing a dead time in which no exposure is performed. In a writing pass of a long exposure time (irradiation time), the influence due to resist heating increases compared with a writing pass of a short exposure time (irradiation time). Thus, in the case of making a difference between totals of exposure time smaller, it is preferable to execute bit processing as follows.

Figure 12A:
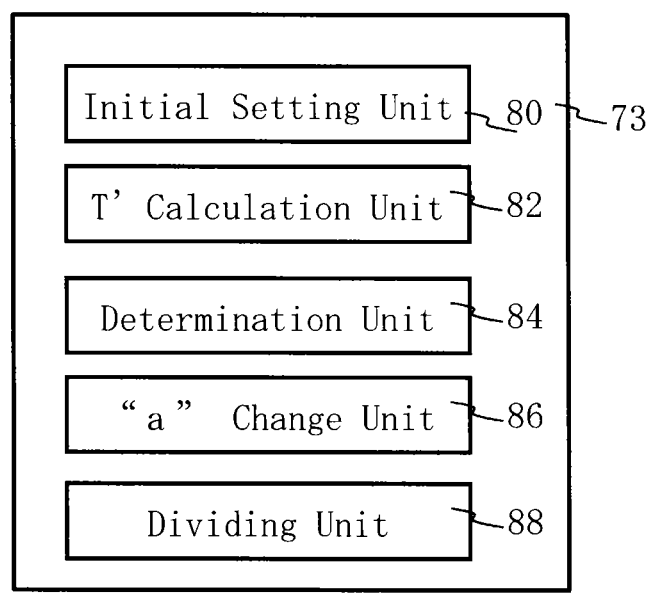
FIGS. 12A and 12B show internal configuration of the bit processing table generation unit and the exposure table generation unit according to the first embodiment.
Figure 12B:
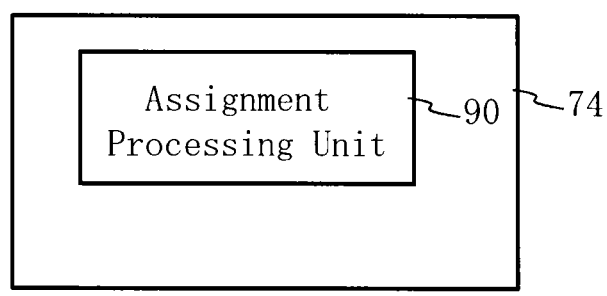

FIGS. 12A and 12B show internal configuration of the bit processing table generation unit and the exposure table generation unit according to the first embodiment. As shown in FIG. 12A, in the bit processing table generation unit 73, there are arranged an initial setting unit 80, a reference irradiation time T' calculation unit 82, a determination unit 84, an irradiation time increase number "a" change unit 86, and a dividing unit 88. As shown in FIG. 12B, in the exposure table generation unit 74, there is arranged an assignment processing unit 90. Each function, such as the initial setting unit 80, the reference irradiation time T' calculation unit 82, the determination unit 84, the irradiation time increase number "a" change unit 86, the dividing unit 88, and the assignment processing unit 90 may be configured by hardware such as an electronic circuit or by software such as a program causing a computer to implement these functions. Alternatively, it may be configured by a combination of hardware and software. Data which is input and output to/from the initial setting unit 80, the reference irradiation time T' calculation unit 82, the determination unit 84, the irradiation time increase number "a" change unit 86, the dividing unit 88, and the assignment processing unit 90 and data being calculated are stored in the memory 112 each time.

Figure 13:
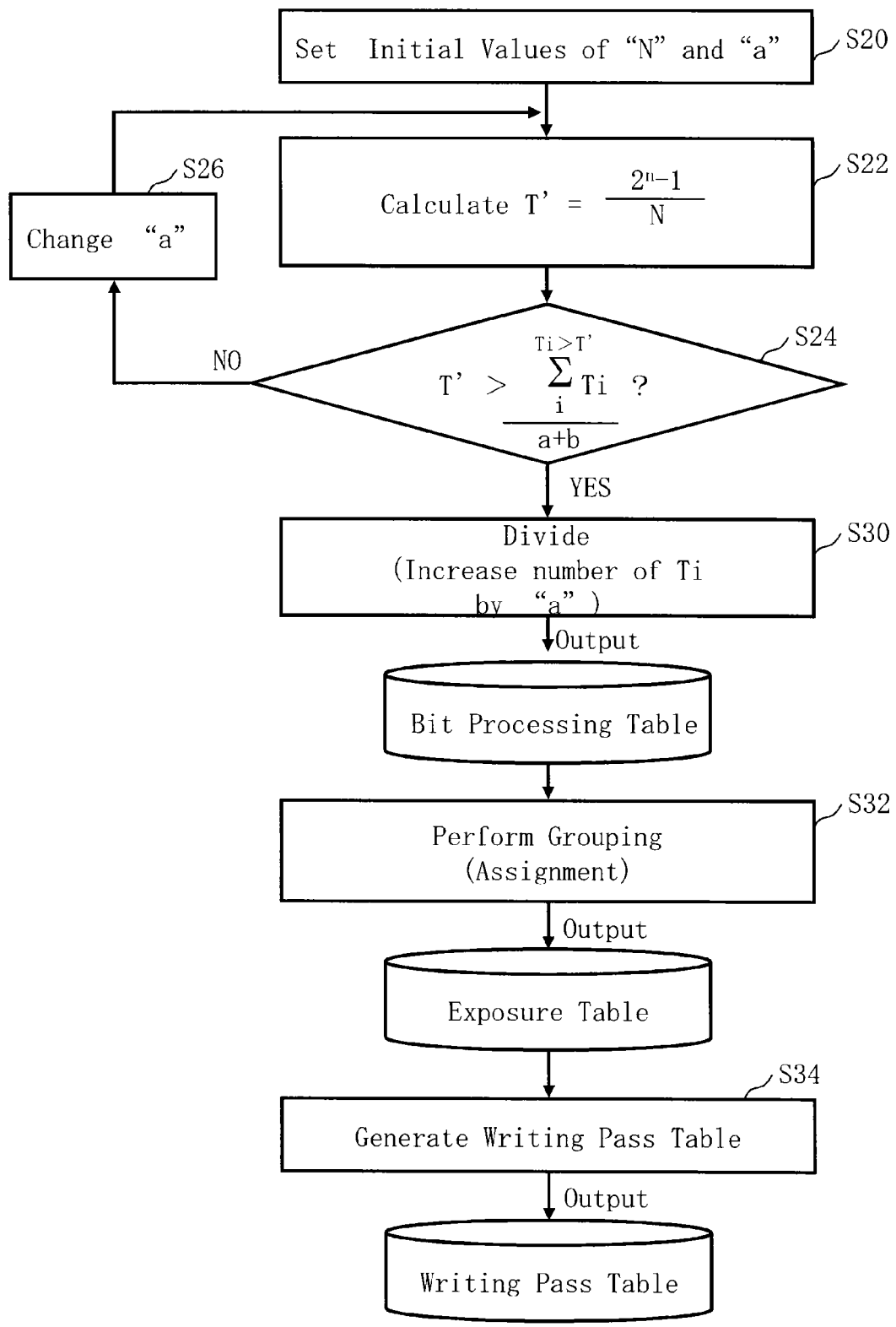
FIG. 13 is a flowchart showing a generation method of a bit processing table and an exposure table according to the first embodiment.

FIG. 13 is a flowchart showing a generation method of a bit processing table, an exposure table, and a writing pass table according to the first embodiment. In FIG. 13, the generation method of a bit processing table, an exposure table, and a writing pass table executes a series of steps: an initial setting step (S20), a reference irradiation time T' calculation step (S22), a determination step (S24), an irradiation time increase number "a" change step (S26), a dividing step (S30), a grouping processing step (S32), and a writing pass table generation step (S34).

The bit processing table generation unit 73 generates a bit processing table showing a relation between a place value "k" of bit data and an irradiation time corresponding to the place value "k" by the following calculation procedure. Total irradiation time of all the passes is divided into "n" number of plurality of irradiation time periods (first irradiation time periods). Each of the irradiation time periods (plurality of first irradiation time periods) is calculated by multiplying a corresponding gray scale value (second gray scale value) of a plurality of gray scale values (plurality of second gray scale values) by $\Delta$, where the plurality of gray scale values (plurality of second gray scale values) are gray scale values defined in decimal numbers converted from each digit value of a binary value (data of binary numbers) of n-digit. Then, a part (second irradiation time periods), being a number "b", of the "n" number of plurality of irradiation time periods is further divided into a plurality of irradiation time periods (third irradiation time periods). Then, divided (a+b) number of plurality of irradiation time periods (third irradiation time periods), "a" being explained below, and the remaining undivided (n–b) number of plurality of irradiation time periods (first irradiation time periods) are used for generating a bit processing table.

In the initial setting step (S20), the initial setting unit 80 sets an initial value for each of an increased number "a" of irradiation time periods (an irradiation time increased number "a") and a multiplicity N (the number of passes) in multi-pass writing, wherein the increased number "a" of irradiation time periods indicates that the "n" number of plurality of irradiation time periods, "n" being a digit number, is increased by "a". For example, in the list shown in FIG. 8, the irradiation time is divided into ten irradiation time periods, where ten is the number of digits whose place values "k" are 0 to 9. For example, if dividing two of the ten irradiation time periods into four, since two irradiation time periods become four irradiation time periods, the ten-digit number irradiation time become twelve irradiation time periods totally, and thus, the irradiation time increased number "a" is two (a=2). For example, if dividing two of the ten irradiation time periods into six, since two irradiation time periods become six irradiation time periods, the ten-digit irradiation time become fourteen irradiation time periods totally, and thus, the irradiation time increased number "a" is four (a=4). Here, it is supposed that "a" is two (a=2).

In the reference irradiation time T' calculation step (S22), the reference irradiation time T' calculation unit 82 calculates a reference irradiation time T' by solving the following equation (3), using the digit number "n", the multiplicity N (the number of passes), and the quantization unit $\Delta$.

$$T' = \frac{(2^n - 1)}{N} \Delta \quad (3)$$

For example, in the case of n=10 and N=4, the reference irradiation time T'=255.8$\Delta$(=1023$\Delta$/4}). Then, it is determined whether the calculated reference irradiation time T' is appropriate or not.

In the determination step (S24), the determination unit 84 determines whether the calculated reference irradiation time T' satisfies the following equation (4) or not, by using the irradiation time increased number "a", the irradiation time Ti (first irradiation time period) being an irradiation time of the i-th digit of the binary number, in irradiation time periods (first irradiation time periods) of "n" number of plurality of irradiation steps, where "n" being the number of digits, and "b" being the number of irradiation time periods to be divided as a part of the irradiation time periods (first irradiation time periods) of the "n" number of plurality of irradiation steps.

$$T' > \frac{\sum_{i}^{Ti > T'} Ti}{a + b} \quad (4)$$

For example, in the case of n=10, a=2, and the reference irradiation time T'=255.8$\Delta$ in the bit table of FIG. 9, with respect to the irradiation time period Ti that exceeds 255.8$\Delta$, there are two 256$\Delta$ and 512$\Delta$. According to the first embodiment, irradiation time periods exceeding the reference irradiation time T' are dividing targets. Therefore, "b", irradiation time periods exceeding the reference irradiation time T' are dividing targets. which is the number of irradiation time periods (second irradiation time periods) to be divided, as a part of the irradiation time periods (first irradiation time periods) of the "n" number of plurality of irradiation steps is calculated to be two (b=2). Accordingly, the right-hand side of the equation (4) is calculated to be (256+512)/(2+2)=192, which satisfies the equation (4). When the calculated reference irradiation time T' does not satisfy the equation (4), it proceeds to the irradiation time increase number "a" change step (S26).

In the irradiation time increase number "a" change step (S26), the irradiation time increase number "a" change unit 86 changes an increased number "a" of irradiation time periods. Then, it returns to the reference irradiation time T' calculation step (S22). Then, in the determination step (S24), each of the steps from the reference irradiation time T' calculation step (S22) to the irradiation time increase number "a" change step (S26) is repeated until the calculated reference irradiation time T' satisfies the equation (4).

As described above, the reference irradiation time T', and the number "b" of irradiation time periods to be divided and the increased number "a" of irradiation time periods, concerning this reference irradiation time T', are calculated. In the determination step (S24), when the calculated reference irradiation time T' satisfies the equation (4), it proceeds to the dividing step (S30).

In the dividing step (S30), with respect to the "n" irradiation time periods (the first irradiation time periods), "n" being the number of digits, the dividing unit 88 divides "b" irradiation time periods Ti (second irradiation time periods), each of which is greater than the reference irradiation time T', into a plurality of irradiation time periods (third irradiation time periods) so that the number of a plurality of irradiation time periods (first irradiation time periods) may be increased by "a". Specifically, for example, in the above-described case of n=10, a=2, b=2, and T'=255.8$\Delta$, there are two irradiation time periods Ti, namely 256$\Delta$ and 512$\Delta$. Therefore, the two irradiation time periods, 256$\Delta$ and 512$\Delta$, are divided into four (a+b) irradiation time periods.

FIG. 14 shows another example of a bit processing table representing a relation between each digit number and an irradiation time of each digit, after the dividing, in the case of the digit number n=10, according to the first embodiment.

In FIG. 14, the irradiation time from the first digit (k=0) (the first bit) to the eighth digit (k=7) (the eighth bit) are the same as those in FIG. 8. In FIG. 14, the ninth digit (k=8) (the ninth bit) is divided into k=8a and k=8b, the irradiation time of each of which is made to be 128Δ. The tenth digit (k=9) (the tenth bit) is divided into k=9a and 9b, the irradiation time of each of which is made to be 256Δ. Thus, combination of twelve (n+a) irradiation time periods is totally obtained.

As described above, the bit processing table generation unit 73 generates a bit processing table which is for generating (n+a)-digit binary number data to define an irradiation time per shot. The generated bit processing table is stored in the storage device 144. The ON/OFF data of irradiation time after the dividing is configured so that the ON/OFF data of irradiation time before dividing may be succeeded. That is, for example, if the ON/OFF data of the irradiation time of the tenth digit (the tenth bit) is ON, the ON/OFF data of the irradiation time of the divided k=9a and 9b is also to be ON. If the ON/OFF data of the irradiation time of the ninth (the ninth bit) is ON, the ON/OFF data of the irradiation time of the divided k=8a and k=8b is also to be ON. Thereby, even if the dividing is performed, the total of the irradiation time per shot can be the same. The bit processing table should be generated before starting writing processing.

By the procedure described above, "n" irradiation time periods, "n" being the digit number, are regenerated to be (n+a) irradiation time periods. In other words, one shot is redivided into (n+a) irradiation steps from "n" irradiation steps.

Next, the exposure table generation unit 74 generates a grouped exposure table by assigning each irradiation time of the generated bit processing table to one of a plurality of groups (irradiation time group) which is composed a combination of at least two irradiation time periods.

In the grouping processing step (S32), for each shot of beams, the assignment processing unit 90 performs assignment by the following calculation procedure. As mentioned above, a maximum irradiation time period per the shot of the multiple beams is divided into "n" irradiation time periods (plurality of first irradiation time periods). Each of the "n" irradiation time periods is calculated by multiplying a corresponding gray scale value (second gray scale value) of a plurality of gray scale values (plurality of second gray scale values) by Δ, where the plurality of gray scale values (plurality of second gray scale values) are gray scale values defined in decimal numbers converted from each digit value of a binary value (data of binary numbers) of n-digit. Further "b" irradiation time periods (plurality of second irradiation time periods), which are a part of the "n" irradiation time periods, are divided into "(b+a)" irradiation time periods (plurality of third irradiation time periods). The assignment processing unit 90 assigns the plurality of irradiation time periods (third irradiation time periods) and the remaining undivided irradiation time periods (first irradiation time periods) to one of a plurality of irradiation time groups which is composed a combination of at least two irradiation time periods. Specifically, the assignment is performed as follows. The divided irradiation time periods (third irradiation time periods) and the remaining undivided irradiation time periods (first irradiation time periods) are assigned to one of a plurality of groups. Here, the assignment processing unit 90 assigns such that combination of smaller (shorter) irradiation time period of the irradiation time periods and larger (longer) irradiation time period of the irradiation time periods is assigned in order to one of a plurality of groups. Thus, with respect to a plurality of irradiation steps, which is obtained by further dividing the "n" irradiation steps or a part of the "n" irradiation steps, "n" being the number of digits, into a plurality irradiation steps more than the "n" irradiation steps, the assignment processing unit 90 sets a plurality of groups by grouping a plurality of irradiation steps.

FIG. 15 shows another example of a grouped exposure table according to the first embodiment. Similarly to FIG. 14, FIG. 15 shows the case where the irradiation time (the exposure time) is divided into twelve irradiation time periods. In the example of FIG. 15, as the exposure step 1, the group 1 is configured by the first digit (k=0) (the first bit) and the twelfth digit (the twelfth bit) which is a division (k=9b) of the tenth digit (the tenth bit) in the bit processing table of FIG. 14. As the exposure step 2, the group 2 is configured by the second digit (k=1) (the second bit) and the eleventh digit (the eleventh bit) which is a division (k=9a) of the tenth digit (the tenth bit). As the exposure step 3, the group 3 is configured by the third digit (k=2) (the third bit) and the tenth digit (the tenth bit) which is a division (k=8b) of the ninth digit (the ninth bit). As the exposure step 4, the group 4 is configured by the fourth digit (k=3) (the fourth bit) and the ninth digit (the ninth bit) which is a division (k=8a) of the ninth digit (the ninth bit). As the exposure step 5, the group 5 is configured by the fifth digit (k=4) (the fifth bit) and the eighth digit (k=7) (the eighth bit). As the exposure step 6, the group 6 is configured by the sixth digit (k=5) (the sixth bit) and the seventh digit (k=6) (the seventh bit).

The grouped exposure table generated as described above is stored in the storage device 144. The exposure table should be generated before starting writing processing.

In the writing pass table generation step (S34), the writing pass table generation unit 76 assigns each group having been grouped to one of writing passes (writing processing) of multiplicity N. Specifically, it assigns as follows. The writing pass table generation unit 76 assigns each group to one of the writing passes (writing processing) of multiplicity N so that it may be closer to the calculated reference irradiation time T'. Then, with respect to a plurality of irradiation steps, which is obtained by further dividing the "n" irradiation steps or a part of the "n" irradiation steps, "n" being the number of digits, into a plurality of irradiation steps more than the "n" irradiation steps, a plurality of groups are set by grouping a plurality of irradiation steps and allotted, by unit of group, to a plurality of writing passes (writing processing).

FIG. 16 shows another example of a writing pass table according to the first embodiment. In FIG. 16, the case of n=10 is shown similarly to FIGS. 14 and 15. In the first embodiment, since the irradiation time of all the passes of multi-pass writing is divided into (n+a) irradiation steps shown in FIG. 14, what is necessary is just to allot each exposure step (each group) shown in FIG. 15 to one of writing passes of multi-pass writing. In the example of FIG. 16, as the writing pass 1 being the first pass (the first writing processing), each digit of the exposure step 1 is assigned. As the writing pass 2 being the second pass (the second writing processing), each digit of the exposure step 2 is assigned. As the writing pass 3 being the third pass (the third writing processing), each digit of the exposure steps 3 and 4 is assigned. As the writing pass 4 being the fourth pass (the fourth writing processing), each digit of the exposure steps 5 and 6 is assigned. Thereby, compared with the writing pass table shown in FIG. 11, the total irradiation time (the maximum of a total exposure time) in each pass can be closer to a uniform value. According to the first embodiment, the numbers of irradiation steps performed in one writing processing and in other, at least one other, writing processing of multi-pass writing may be different from each other.

Here, as shown in FIG. 16, the total irradiation time of the writing pass shown by the writing pass 3 is 268Δ, whereas the total irradiation time of the writing pass shown by the writing pass 4 is 210Δ. Thus, the total of exposure time (irradiation time) can be suppressed to a difference of less than one time between writing passes. As described above, making a difference between totals of the exposure time (the irradiation time) of writing passes small indicates making the exposure time (the irradiation time) of the writing pass which has been a minimum exposure time (an irradiation time) large, and thus, the stage speed can be decreased. Consequently, the writing precision is improved. When not changing the stage speed per writing pass, degradation of throughput can be suppressed as the dead time in which no exposure is performed becomes small, and operation speed increase of the shift register in a pass whose exposure time is small can be avoided. Furthermore, making a difference between totals of the exposure time (the irradiation time) of writing passes small indicates making the exposure time (the irradiation time) of the writing pass which has been a maximum exposure time (an irradiation time) small, and thus, dimensional variation phenomenon by resist heating can be reduced or avoided.

The writing pass table generated as described above is stored in the storage device 144. The writing pass table should be generated before starting writing processing. Although, in the example described above, the writing pass table is generated in the writing apparatus 100, it is not limited thereto. If the digit number "n" which is used when converting the irradiation time per shot into binary number data and the multiplicity N have been previously set, the writing pass table itself can also be set beforehand. Therefore, it is also preferable to generate a writing pass table outside the apparatus in advance, and to input it to the writing apparatus 100 to be stored in the storage device 144. In other words, it is also preferable to prepare the bit processing table generation unit 73, the exposure table generation unit 74, and the writing pass table generation unit 76 shown in FIGS. 1, 12A and 12B, as external devices.

In the irradiation time arrangement data processing step (S109), referring to the bit processing table stored in the storage device 144, the bit processing unit 70 converts n-digit binary number data, which was converted in the conversion to binary number step (S108), into (n+a)-digit binary number data. For example, in the case of the bit processing table of FIG. 14, 10-digit binary number data is converted to 12-digit binary number data. For example, if N=50, ten digits "0000110010" is converted to twelve digits "000000110010". For example, if N=500, similarly, ten digits "0111110100" is converted to twelve digits "001111110100". In that case, since the ninth digit of the ten-digit binary number data is "1" and the tenth digit of it is "0", the ninth digit and the tenth digit, (8a and 8b), are "1", and the eleventh digit and the twelfth digit, (9a and 9b), are "0" in the value of twelve digits after processing. For example, if N=700, similarly, ten digits "1010111100" is converted to twelve digits "110010111100". For example, if N=1023, similarly, ten digits "1111111111" is converted to twelve digits "111111111111".

In the irradiation time arrangement data output step (S110), the transmission processing unit 68 outputs, for each beam shot, irradiation time arrangement data having been converted to (n+a)-digit binary number data, to the deflection control circuit 130. In that case, referring to the writing pass table stored in the storage device 144, the transmission processing unit 68 outputs, for each writing pass (writing processing), corresponding irradiation time arrangement data to the deflection control circuit 130.

In the target writing pass data transmission step (S112), the deflection control circuit 130 outputs, for each shot of beams, irradiation time arrangement data of a target writing pass to the logic circuit 41 for each beam. Moreover, synchronized with this, the deflection control circuit 130 outputs timing data of each irradiation step to the logic circuit 132 for common blanking.

According to the first embodiment, since the shift register 40 is used for the logic circuit 41 as shown in FIG. 5, the deflection control circuit 130 transmits data of each bit used in the same writing pass to each logic circuit 41 of the blanking plate 204 in the order of beam arrangement (or in the order of identification number). Moreover, a clock signal (CLK1) for synchronization, a read signal (read) for data read-out, and an adder signal (BLK) are output. For example, as the data of the $k_1$-th bit (the $k_1$-th digit) and the $k_2$-th bit (the $k_2$-th digit) that configure the k-th writing pass of the beam 1, two bits "11" are generated. As the data of the $k_1$-th bit (the $k_1$-th digit) and the $k_2$-th bit (the $k_2$-th digit) that configure the k-th writing pass of the beam 2, two bits "11" are generated. As the data of the $k_1$-th bit (the $k_1$-th digit) and the $k_2$-th bit (the $k_2$-th digit) that configure the k-th writing pass of the beam 3, two bits "00" are generated. As the data of the $k_1$-th bit (the $k_1$-th digit) and the $k_2$-th bit (the $k_2$-th digit) that configure the k-th writing pass of the beam 4, two bits "11" are generated. As the data of the $k_1$-th bit (the $k_1$-th digit) and the $k_2$-th bit (the $k_2$-th digit) that configure the k-th writing pass of the beam 5, two bits "00" are generated. From the end beam side, the deflection control circuit 130 transmits each 2-bit data of "0011001111". Then, from the upper side shift register to the next one, the shift register 40 of each beam transmits data in order, two bits by two bits, according to a clock signal (CLK1). For example, with respect to the data of the k-th writing pass of the beams 1 to 5, by five clock signals, 2-bit data "11" is stored in the shift register 40 of the beam 1, 2-bit data "11" is stored in the shift register 40 of the beam 2, 2-bit data "00" is stored in the shift register 40 of the beam 3, 2-bit data "11" is stored in the shift register 40 of the beam 4, and 2-bit data "00" is stored in the shift register 40 of the beam 5.

Next, when inputting a read signal (read), the register 42 of each beam reads in the k-th writing pass data of each beam from the shift register 40. In the example described above, as the data of the k-th writing pass, 2-bit data "11" is stored in the register 42 of the beam 1, 2-bit data "11" is stored in the register 42 of the beam 2, 2-bit data "00" is stored in the register 42 of the beam 3, 2-bit data "11" is stored in the register 42 of the beam 4, and 2-bit data "00" is stored in the register 42 of the beam 5. When inputting the data of the k-th writing pass, the individual register 42 of each beam outputs, according to the data, an ON/OFF signal to the AND computing unit 44 through the selector 48. If the data of the k-th writing pass is "11", two ON signals should be output, and if it is "00", two OFF signals should be output. If the data of the k-th writing pass is "10", an ON signal and an OFF signal should be output in the order of ON and OFF, and if is "01", an OFF signal and an ON signal should be output in the order of OFF and ON. In the first embodiment, since it is a 2-bit signal, the output of the individual register 42 is switched from the output of the $k_1$-th bit (the $k_1$-th digit) to the output of the $k_2$-th bit (the $k_2$-th digit) by switching the selector 48. When the selector 48 inputs a select signal (select), one is switched to the other in a 2-bit signal. If the BLK signal is an ON signal and the signal of the register 42 is ON, the AND computing unit 44 outputs an ON signal to the amplifier 46, and then, the amplifier 46 applies an ON voltage to the electrode 24 of the individual blanking deflector. In other case, the AND computing unit 44 outputs an OFF signal to amplifier 46, and then, the amplifier 46 applies an OFF voltage to the electrode 24 of the individual blanking deflector.

In the case of being configured by a plurality of groups like the writing passes 3 and 4 shown in FIG. 16, while the 2-bit data of the first group of the k-th writing pass is being processed, the deflection control circuit 130 should transmit 2-bit data of the next group of the k-th writing pass to each logic circuit 41 of the blanking plate 204 in the order of beam arrangement (or in the order of identification number).

The AND computing unit 44 shown in FIG. 5 may be omitted. However, it is effective in that a beam can be controlled to be OFF by the AND computing unit 44 in the case of not being able to make the beam OFF because of a trouble of one of elements of the logic circuit 41.

In the target writing pass writing step (S114), for each beam shot, writing is performed based on irradiation time of each irradiation step of a target writing pass, in irradiation divided into a plurality of irradiation steps of a plurality of writing passes.

Figure 17:
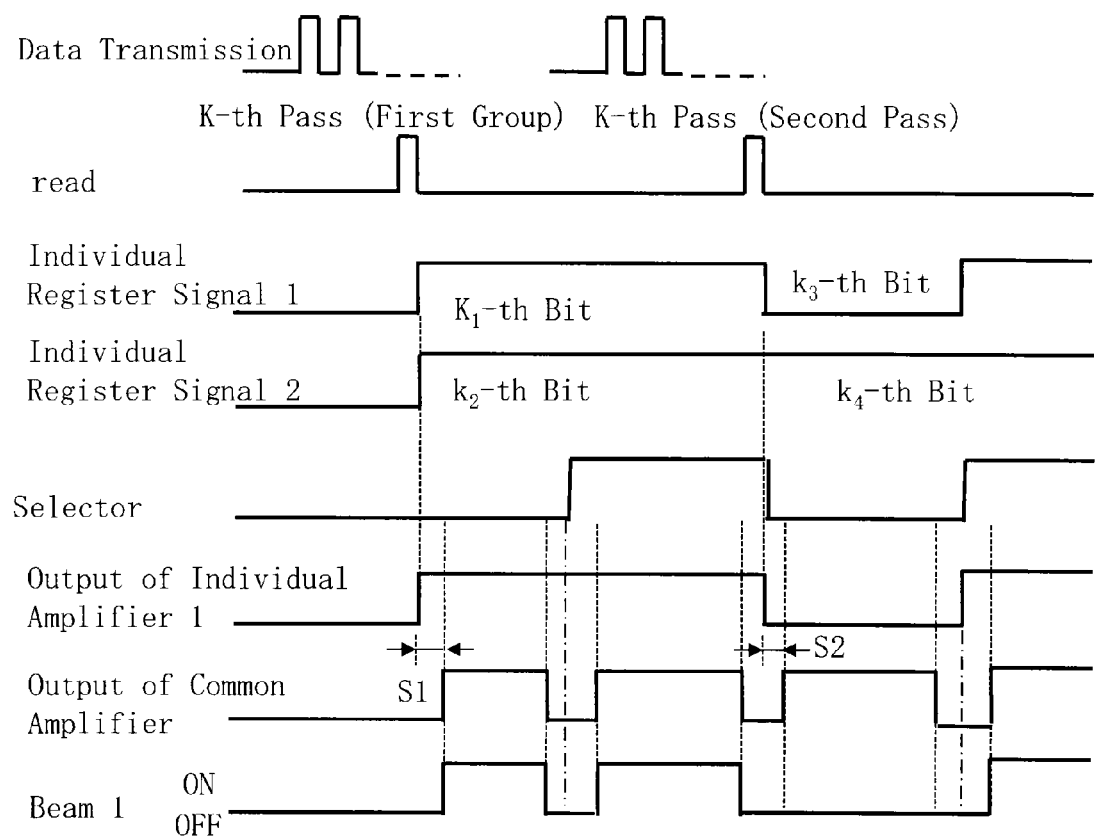
FIG. 17 is a timing chart showing a beam ON/OFF switching operation with respect to an irradiation step in one writing pass in all the writing passes according to the first embodiment.

FIG. 17 is a timing chart showing a beam ON/OFF switching operation with respect to an irradiation step in one writing pass in all the writing passes according to the first embodiment. FIG. 17 shows one beam (beam 1), for example, in a plurality of beams configuring multiple beams. Here, for example, in multi-pass writing that irradiates the same position, irradiation steps are shown from the first group composed of the $k_1$-th bit (the $k_1$-th digit) and the $k_2$-th bit (the $k_2$-th digit) of the beam 1 irradiating the k-th writing pass to the next group (the second group) composed of the $k_3$-th bit (the $k_3$-th digit) and the $k_4$-th bit (the $k_4$-th digit). For example, it is the case of being composed of a plurality of groups, like the writing passes 3 and 4 shown in FIG. 16. In the case of being composed of one group like the writing passes 1 and 2 shown in FIG. 16, it should be understood that there is no next group (the second group) mentioned above.

The irradiation time arrangement data shows the case of, for example, the $k_1$-th bit (the $k_1$-th digit) being "1", the $k_2$-th bit (the $k_2$-th digit) being "1", the $k_3$-th bit (the $k_3$-th digit) being "0", and the $k_4$-th bit (the $k_4$-th digit) being "1".

First, in response to an input of a read signal of the top group (the first group) of the k-th wiring pass composed of the $k_1$-th bit (the $k_1$-th digit) and the $k_2$-th bit (the $k_2$-th digit), the individual register 42 (an individual register signal 1 and an individual register signal 2) outputs an ON/OFF signal, according to the stored data (two bits) of the $k_1$-th bit (the $k_1$-th digit) and the $k_2$-th bit (the $k_2$-th digit). In the first embodiment, since a 2-bit signal is used, it is necessary to perform selecting and switching the signal. In FIG. 17, first, data of the individual register 1 is selected by the selector 48, and an ON signal of the $k_1$-th bit (the $k_1$-th digit) is output to the individual amplifier. Next, with respect to an output of the individual register 42, data of the individual register signal 2 is selected by the switching of the selector 48, and the output of the $k_1$-th bit (the $k_1$-th digit) is switched to the output of the $k_2$-th bit (the $k_2$-th digit). Hereafter, switching like this is serially repeated for each irradiation step.

Since the data of the $k_1$-th bit ($k_1$-th digit) is ON data, the individual amplifier 46 (an individual amplifier 1) outputs an ON voltage to be applied to the blanking electrode 24 for the beam 1. On the other hand, in the logic circuit 132 for common blanking, ON or OFF is switched depending upon timing data of each irradiation step of (n+a) bits (e.g., twelve bits). In the common blanking system, an ON signal is output during the irradiation time of each irradiation step of each group. For example, if 0=1 ns, the irradiation time of the first irradiation step (e.g., the irradiation step of k=2) of the top group (the first group) of the k-th writing pass is 4Δ=4 ns. The irradiation time of the second irradiation step (e.g., the irradiation step of k=8b (the tenth digit)) is 128Δ=128 ns. The irradiation time of the first irradiation step (e.g., the irradiation step of k=8a) of the next group (the second group) is 128Δ=128 ns. Similarly, it becomes ON during the irradiation time of each irradiation step of each writing pass, hereinafter. In the logic circuit 132, when inputting timing data of each irradiation step to the register 50, the register 50 outputs ON data of the k-th digit (the k-th bit), the counter 52 counts the irradiation time of the k-th digit (the k-th bit), and controlling is performed to be OFF after the irradiation time has passed. Hereafter, beam irradiation of the target writing pass is performed for each writing pass.

As described above, according to the first embodiment, data transmission time period of data for irradiating next position can be included in a time period while each corresponding irradiation step is irradiating the just previous position to be irradiated by assigning, with respect to any shot of each writing pass, the irradiation time of all the writing passes such that the total of the irradiation time becomes close to the reference irradiation time T as much as possible.

In the common blanking system, compared with ON/OFF switching of the individual blanking system, ON/OFF switching is performed after the voltage stabilization time (settling time) S1/S2 of the amplifier 46 has passed. In the example of FIG. 17, after the individual amplifier 1 has become ON and the settling time S1 of the individual amplifier 1 at the time of switching from OFF to ON has passed, the common amplifier becomes ON. Thereby, beam irradiation at an unstable voltage at the time of rise of the individual amplifier 1 can be eliminated. Then, the common amplifier becomes OFF when the irradiation time of the k-th digit (the k-th bit) being a target has passed. Consequently, in the case of both the individual amplifier and the common amplifier being ON, an actual beam becomes ON, and irradiates the target object 101. Therefore, it is controlled such that the ON time period of the common amplifier becomes an actual beam irradiation time period. On the other hand, in the case where the common amplifier becomes ON when the individual amplifier 1 is OFF, after the individual amplifier 1 becomes OFF and the settling time S2 of the individual amplifier 1 at the time of switching from ON to OFF has passed, the common amplifier becomes ON. Thereby, beam irradiation at an unstable voltage at the time of fall of the individual amplifier 1 can be eliminated.

As described above, in the individual beam ON/OFF switching step (S116), beam ON/OFF control is individually performed for each corresponding beam in multiple beams by a plurality of individual blanking systems (blanking plate 204, etc.), and, for each beam, with respect to each irradiation step (irradiation) of the corresponding group of the k-th writing pass, beam ON/OFF switching is performed by the individual blanking system for the beam concerned. In the example of FIG. 17, since the irradiation step of the $k_2$-th digit (the $k_2$-th bit) of the k-th writing pass is not beam OFF, switching from ON to OFF is not performed. However, for example, if the irradiation step of the k$_2$-th digit (the k$_2$-th bit) is beam OFF, it should be understood that switching from ON to OFF is performed.

In the common beam ON/OFF switching step (S118), for each beam, with respect to each irradiation step (irradiation) of the k-th writing pass, after performing beam ON/OFF switching by the individual blanking system, beam ON/OFF controlling is performed all at once for the whole of the multiple beams by using the common blanking system (the logic circuit 132, the deflector 212, etc.), and blanking control is performed so that it may be in a beam ON state during the irradiation time corresponding to each irradiation step (irradiation) of the k-th writing pass.

As described above, since there is a restriction on the installation area of the circuit and the current to be used in the circuit in the blanking plate 204, a simple amplifier circuit is used. Therefore, it is also limited in reducing the settling time of the individual amplifier. By contrast, in the common blanking system, a highly precise amplifier circuit of sufficient size, current, and scale can be installed outside the optical column. Therefore, the settling time of the common amplifier can be shortened. Thus, according to the first embodiment, by making beam ON by the common blanking system after becoming beam ON by the individual blanking system (or after a read signal of a target digit is output) and after the settling time having passed, it becomes possible to eliminate a voltage unstable time of the individual amplifier and a noise component containing crosstalk, on the blanking plate, and to perform a blanking operation based on a highly precise irradiation time.

In the determination step (S120), the writing control unit 72 determines, with respect to irradiation time arrangement data of a beam concerned which repeatedly irradiates the same position, whether transmission of data of all the writing passes has been completed or not. When it has not been completed yet, it proceeds to the group change step (S122). When it has been completed, it proceeds to the determination step (S124).

In the writing pass change step (S122), the writing control unit 72 changes a target writing pass. For example, the writing control unit 72 changes the target writing pass from the k-th writing pass to the (k+1)th writing pass. Then, it returns to the data transmission step (S112) of the target writing pass. With respect to the processing of the (k+1)th writing pass, steps from the data transmission step (S112) to the writing pass change step (S122) of the target writing pass are executed. Then, it is similarly repeated until data processing of all the writing passes with respect to irradiation time arrangement data of a beam concerned irradiating the same position repeatedly has been completed in the determination step (S120).

As described above, each irradiation step is obtained by dividing the entire irradiation steps of all the number of times of writing of a beam concerned into "n" irradiation steps, "n" being the digit number, which is obtained by multiplying a gray scale value N by a quantization unit Δ, wherein the gray scale value is one of gray scale values defined in decimal numbers converted from each digit value of a n-digit binary number, or each irradiation step is obtained by further dividing a part of the "n" irradiation steps in order to obtain a plurality (n+a), being greater than "n", of irradiation steps. Then, using the above each irradiation step as one of irradiation steps included in one of a plurality of writing passes of multi-pass writing, irradiation of beams of irradiation time periods of each set of irradiation steps corresponding to a writing pass concerned is applied to a target object, for each writing pass of the multi-pass writing.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes is irradiated with the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker (the first deflector: individual blanking system) of the blanking plate 204. Each blanker respectively deflects (performs blanking deflection) the electron beam 20 passing individually.

Figure 18:
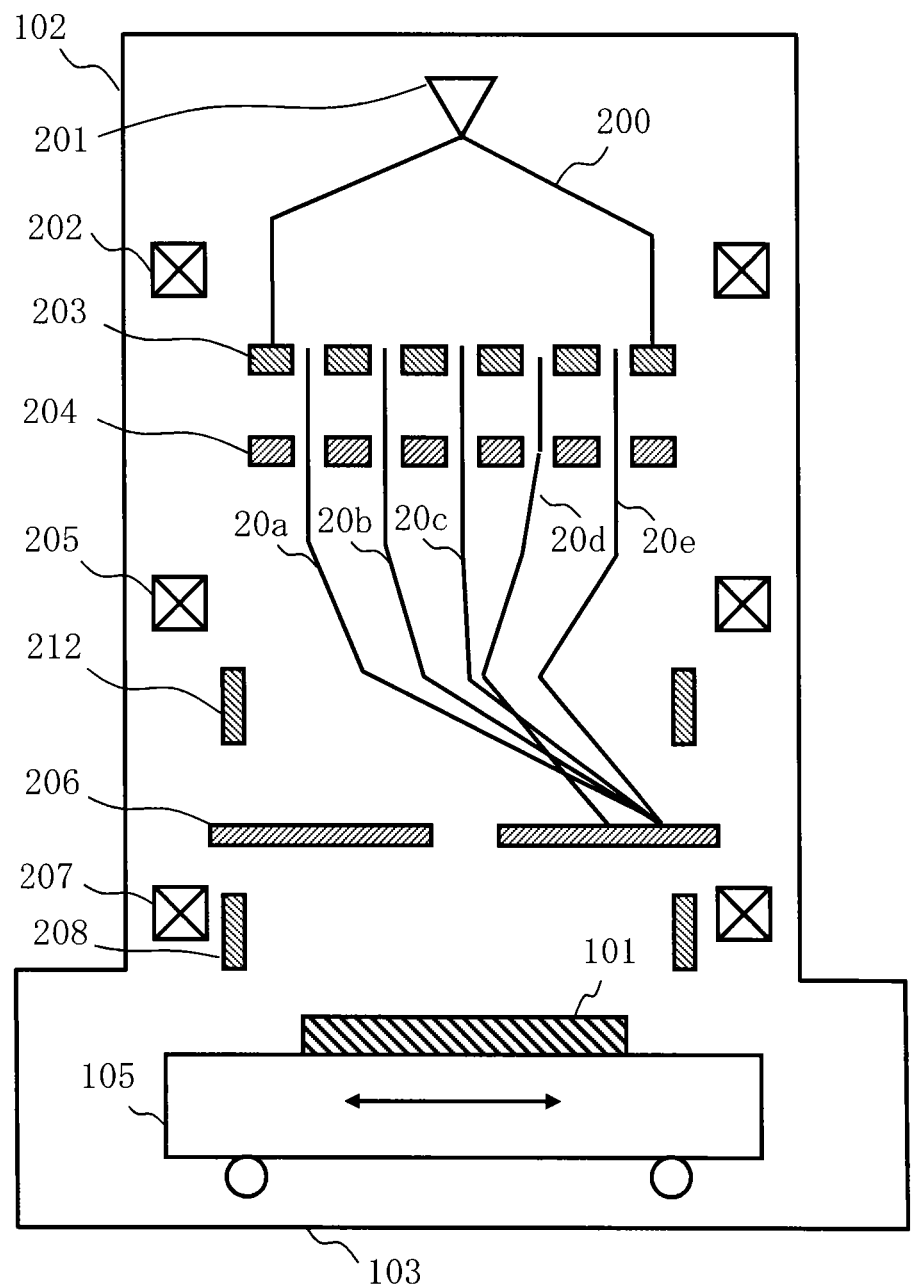
FIG. 18 is a schematic diagram explaining a blanking operation according to the first embodiment.

FIG. 18 is a schematic diagram explaining a blanking operation according to the first embodiment. The multiple beams 20a, 20b, . . . , 20e, having passed through the blanking plate 204 are reduced by the reducing lens 205, and go toward the hole at the center of the limiting aperture member 206. At this stage, the electron beam 20 which was deflected by the blanker of the blanking plate 204 deviates from the hole of the center of the limiting aperture member 206 (blanking aperture member) and is blocked by the limiting aperture member 206. On the other hand, if the electron beam 20 which was not deflected by the blanker of the blanking plate 204 is not deflected by the deflector 212 (common blanking system), it passes through the hole at the center of the limiting aperture member 206, as shown in FIG. 1. Blanking control is performed by combination of ON/OFF of the individual blanking system and ON/OFF of the common blanking system so as to control ON/OFF of the beam. Thus, the limiting aperture member 206 blocks each beam which was deflected to be a beam OFF state by the individual blanking system or the common blanking system. Then, beam of an irradiation step of one irradiation time period in a plurality of irradiation time periods obtained by dividing the total irradiation time of all the writing passes is formed by beams having been made during from a beam ON state to a beam OFF state and having passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, multi-beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be ON according to the pattern.

Figure 19A:
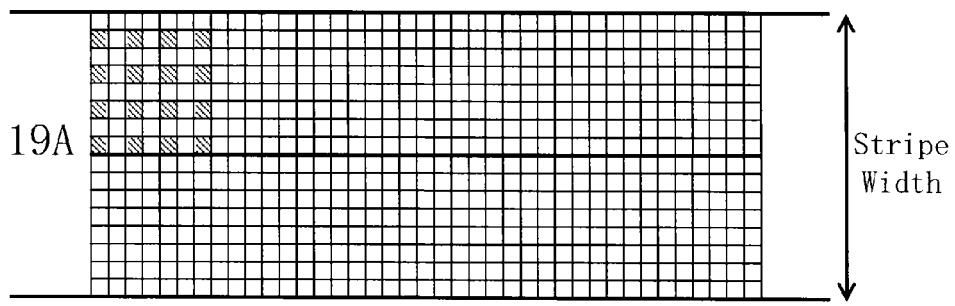
FIGS. 19A to 19C are conceptual diagrams explaining examples of a writing operation in a stripe according to the first embodiment.
Figure 19B:
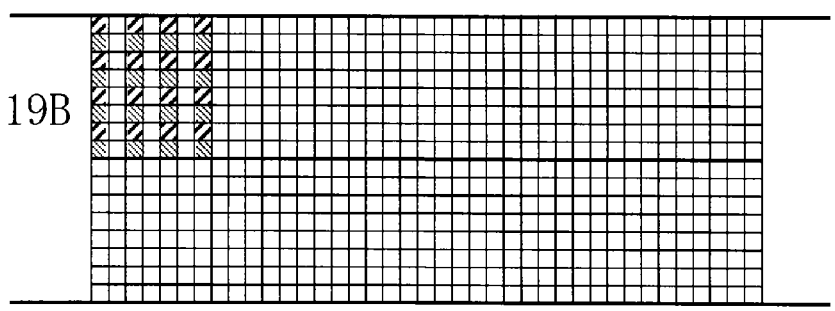
Figure 19C:
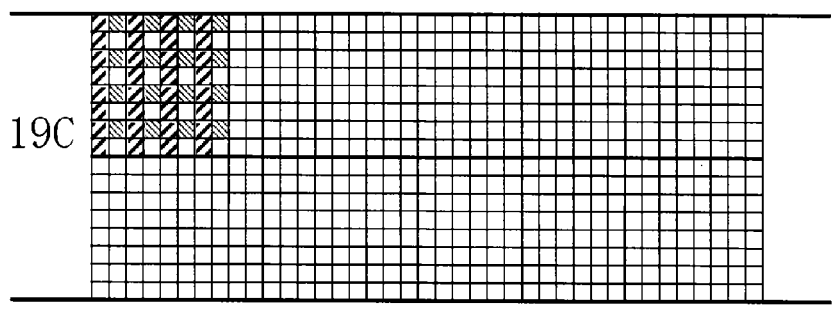

FIGS. 19A to 19C are conceptual diagrams explaining examples of a writing operation in a stripe according to the first embodiment. The examples of FIGS. 19A to 19C show the cases where writing is performed in a stripe by using multiple beams of 4×4 in the x and y directions, for example. The examples of FIGS. 19A to 19C show the cases where a stripe region is divided in the y direction by twice the width of an irradiation region of the whole multi-beam, for example. There is shown the case where exposure (writing) of one irradiation region of the whole of multiple beams is completed by four shots (one shot is a total of a plurality of irradiation steps) performed while shifting the irradiation position by one mesh in the x direction or the y direction. First, the upper region of the stripe region is to be written. FIG. 19A shows the mesh region irradiated by the first one-shot (one shot is a total of a plurality of irradiation steps). Next, as shown in FIG. 19B, the second one-shot (one shot is a total of a plurality of irradiation steps) is performed while shifting the position in the y direction to the mesh region not having been irradiated yet. Next, as shown in FIG. 19C, the third one-shot (one shot is a total of a plurality of irradiation steps) is performed while shifting the position in the x direction to the mesh region not having been irradiated yet.

Figure 20A:
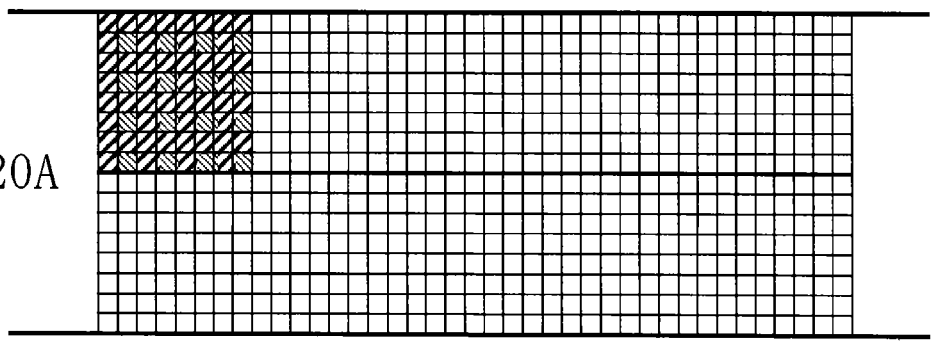
FIGS. 20A to 20C are conceptual diagrams explaining examples of a writing operation in a stripe according to the first embodiment.
Figure 20B:
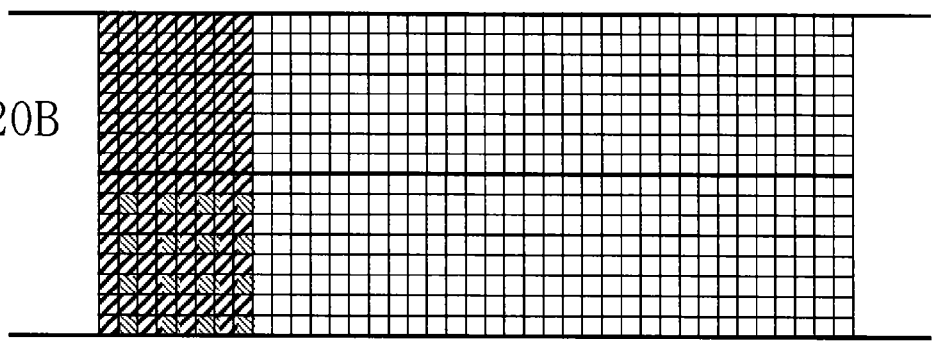
Figure 20C:
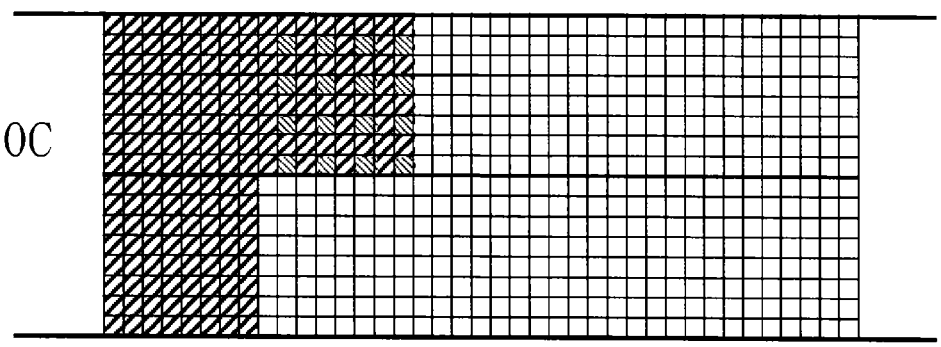

FIGS. 20A to 20C are conceptual diagrams explaining examples of a writing operation in a stripe according to the first embodiment. FIGS. 20A to 20C are continued from FIG. 19C. As shown in FIG. 20A, the fourth one-shot (one shot is a total of a plurality of irradiation steps) is performed while shifting the position in the y direction to the mesh region not having been irradiated yet. Exposure (writing) of one irradiation region of the whole of multiple beams is completed by these four shots (one shot is a total of a plurality of irradiation steps). Next, the lower region of the stripe region is to be written. As shown in FIG. 20B, the lower region of the stripe region is irradiated by the first one-shot (one shot is a total of a plurality of irradiation steps). Next, the second one-shot (one shot is a total of a plurality of irradiation steps) is performed while shifting the position in the y direction to the mesh region not having been irradiated yet. Next, the third one-shot (one shot is a total of a plurality of irradiation steps) is performed while shifting the position in the x direction to the mesh region not having been irradiated yet. The fourth one-shot (one shot is a total of a plurality of irradiation steps) is performed while shifting the position in the y direction to the mesh region not having been irradiated yet. By the operations described above, writing of the first row of the irradiation region of multiple beams in the stripe region is completed. Then, as shown in FIG. 20C, writing is to be similarly performed for the second row of the multiple beam irradiation region while shifting the position in the x direction. The whole stripe region can be written by repeating the operations described above.

Figure 21A:
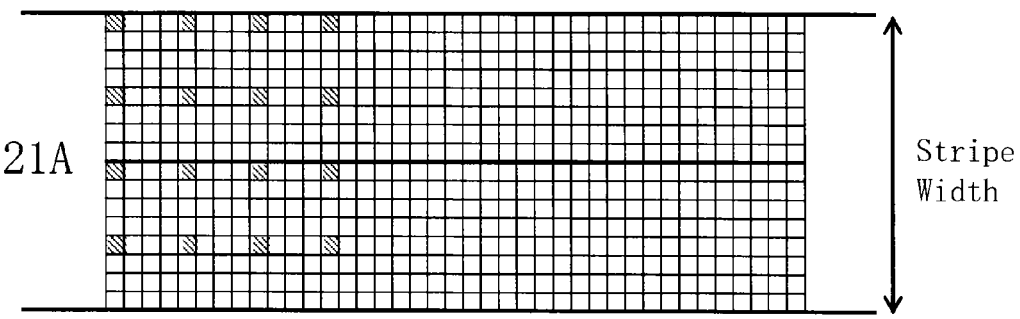
FIGS. 21A to 21C are conceptual diagrams explaining other examples of a writing operation in a stripe according to the first embodiment.
Figure 21B:
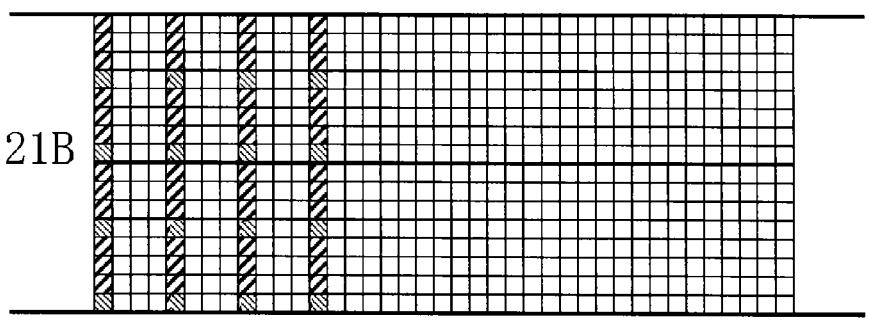
Figure 21C:
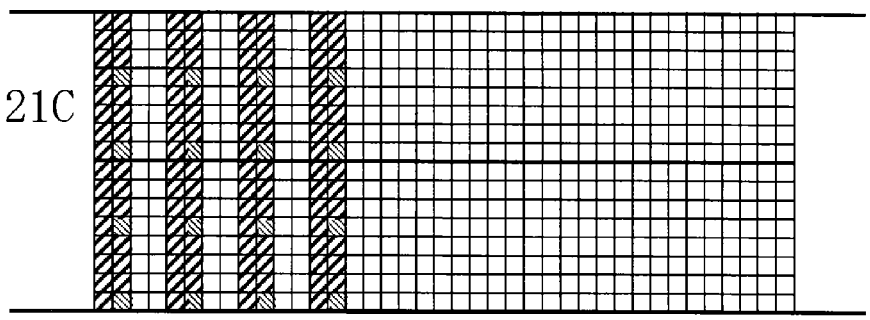

FIGS. 21A to 21C are conceptual diagrams explaining other examples of a writing operation in a stripe according to the first embodiment. FIGS. 21A to 21C show examples in which writing in a stripe is performed using 4×4 multiple beams in the x and y directions. The examples of FIG. 21A to FIG. 21C show the case where there is a distance between beams and a stripe region is divided in the y direction by a width somewhat greater than or equal to the irradiation region of the whole of multiple beams, for example. Exposure (writing) of one irradiation region by the whole of multiple beams is completed by sixteen shots (one shot is a total of a plurality of irradiation steps) performed while shifting the irradiation position by one mesh in the x direction or the y direction. FIG. 21A shows the mesh region irradiated by the first one-shot (one shot is a total of a plurality of irradiation steps). Next, as shown in FIG. 21B, the second one-shot, the third one-shot, and the fourth one-shot (one shot is a total of a plurality of irradiation steps) are performed while shifting the position by one mesh, one by one, in the y direction to the mesh region not having been irradiated yet. Next, as shown in FIG. 21C, the fifth one-shot (one shot is a total of a plurality of irradiation steps) is performed while shifting the position by one mesh in the x direction to the mesh region not having been irradiated yet. Next, the sixth one-shot, the seventh one-shot, and the eighth one-shot (one shot is a total of a plurality of irradiation steps) are performed while shifting the position by one mesh, one by one, in the y direction to the mesh region not having been irradiated yet.

Figure 22A:
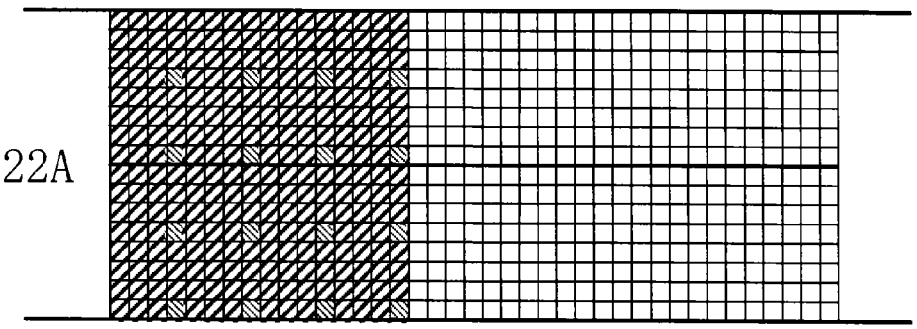
FIGS. 22A to 22C are conceptual diagrams explaining other examples of a writing operation in a stripe according to the first embodiment.
Figure 22B:
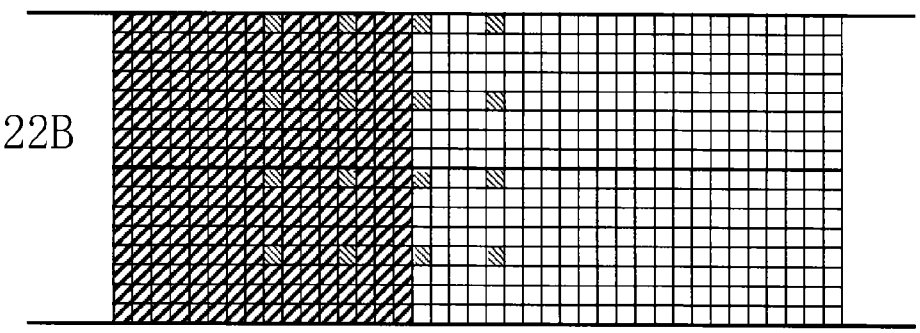
Figure 22C:
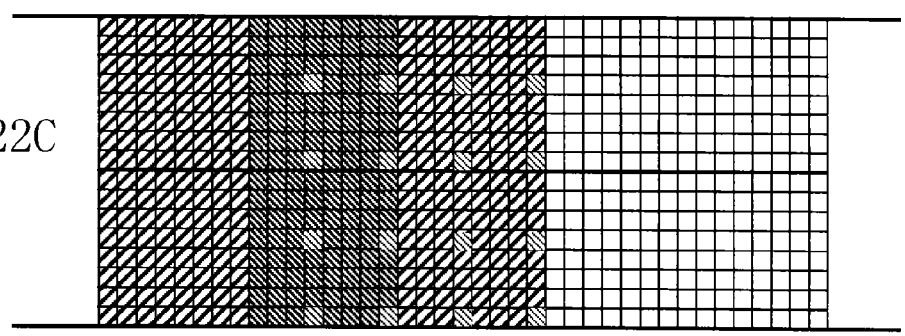

FIGS. 22A to 22C are conceptual diagrams explaining other examples of a writing operation in a stripe according to the first embodiment. FIGS. 22A to 22C are continued from FIG. 21C. As shown in FIG. 22A, the ninth one-shot to the sixteenth one-shot (one shot is a total of a plurality of irradiation steps) are repeatedly performed in order similarly to the operations explained in of FIGS. 21A to 21C. The examples of FIGS. 21A to 21C and 22A to 22C show the case of performing multi-pass writing (multiplicity=2), for example. In such a case, the irradiation position is shifted in the x direction by about half the size of the irradiation region of the whole of multiple beams, and as shown in FIG. 22B, the first one-shot (one shot is a total of a plurality of irradiation steps) of the second layer of the multi-pass writing is performed. As described referring to FIGS. 21B and 21C, the second one-shot to the eighth one-shot (one shot is a total of a plurality of irradiation steps) of the second layer of the multi-pass writing are performed one by one, hereinafter. As shown in FIG. 22C, the ninth one-shot to the sixteenth one-shot (one shot is a total of a plurality of irradiation steps) are to be repeatedly performed in order similarly to the operations of FIGS. 21B and 21C.

In the above explanation, with respect to each writing pass of the multi-pass writing according to the first embodiment, it is also preferable to repeatedly perform writing processing per writing region unit by multiple beams shown in FIG. 20B or 22A in addition to repeatedly perform writing processing per unit of the stripe region 32 or unit of the target object 101 (substrate). Moreover, for example, as shown in FIGS. 22A to 22C, it is also preferable to perform exposing by a method of exposure of multiplicity 2 during writing one stripe, where each stripe region is scanned twice to expose the writing passes 1 and 2 of FIG. 16 by the first time stripe writing, and to expose the writing passes 3 and 4 by the second time stripe writing.

As described above, according to the first embodiment, the circuit configuration of a blanking aperture can be simplified and restriction on the circuit installation space can be maintained by concurrently using the deflector for common blanking and a blanking aperture. Moreover, since the data amount of the logic circuit 41 for individual blanking is two bits, power consumption can also be suppressed. In the multi-pass writing, not only that the restriction on a circuit installation space can be maintained and the precision of dose control can be improved, but also that the amount of data transmission and the number of irradiation steps can be greatly reduced. Furthermore, the operation clock of a circuit, such as a shift register, can be low, and heat generation of a circuit can be reduced. Accordingly, the circuit load of a blanking aperture can be decreased, or the throughput of the whole writing processing can be increased.

Second Embodiment

In the first embodiment, the case where writing processing is repeatedly performed without shifting the position in each writing pass of multi-pass writing has been described, but however, it is not limited thereto. In the second embodiment, there will be explained the case where multi-pass writing that combines the processing (the first writing processing) of repeatedly performing writing processing while shifting the position of a deflection region, and the processing (the second writing processing) of repeatedly performing writing processing without further shifting the position, at the position in each deflection region having been shifted. The apparatus structure of the writing apparatus 100 is the same as that of FIG. 1. The flowchart showing main steps of the writing method according to the second embodiment is the same as that of FIG. 7. Hereafter, the contents of the second embodiment are the same as those of the first embodiment except what is particularly described below.

Figure 23:
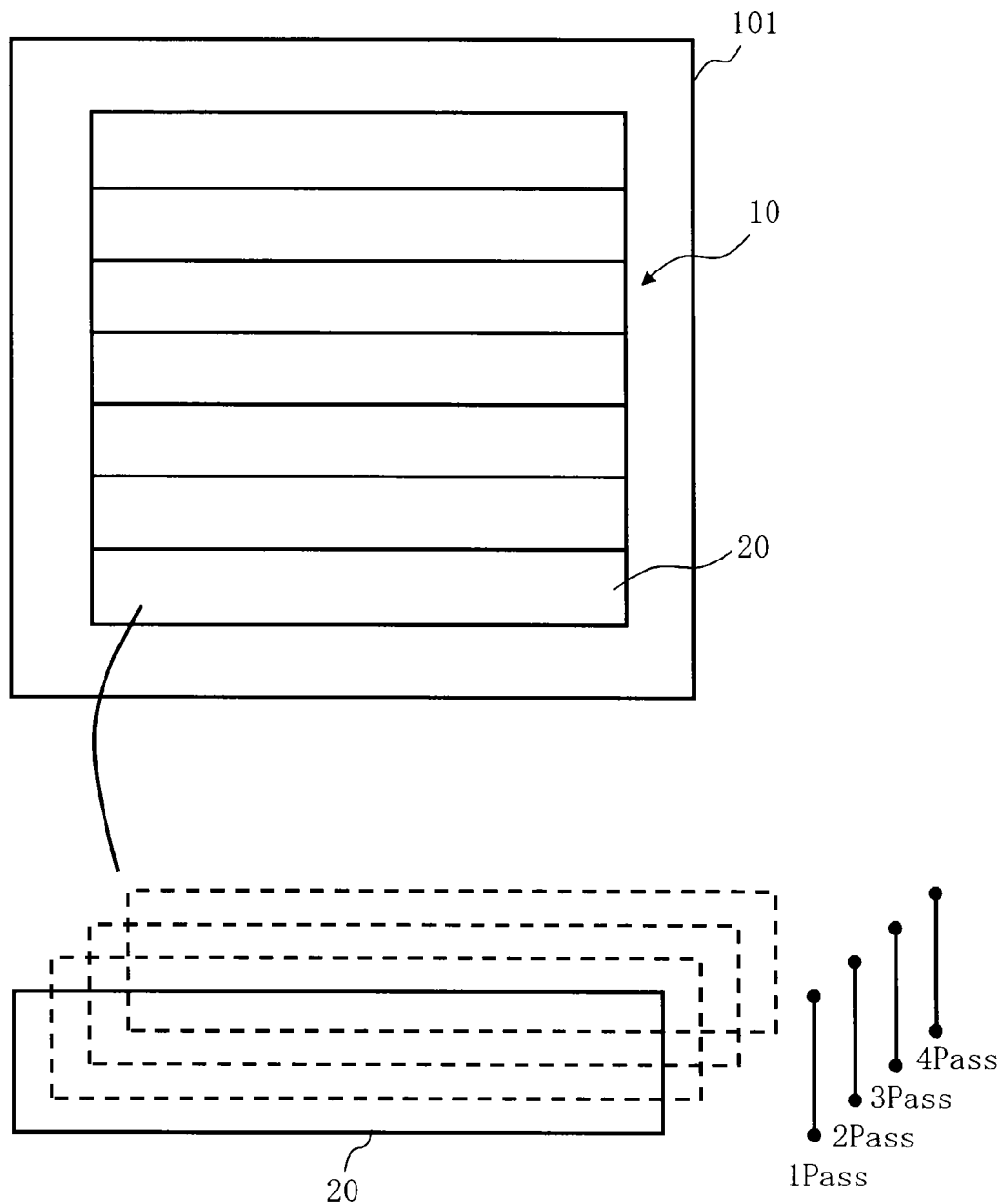
FIG. 23 is a conceptual diagram explaining a writing operation according to the second embodiment.

FIG. 23 is a conceptual diagram explaining a writing operation according to the second embodiment. In FIG. 23, in multi-pass writing, writing processing is performed per stripe region 20 unit while shifting the position in the x and y directions. FIG. 23 shows the writing position of each pass of the processing (the first writing processing) of repeatedly performing writing processing while shifting the position. Position errors, etc. of a figure pattern at the boundary between the stripe regions 20 can be reduced by shifting the position. Moreover, in the second embodiment, processing (second writing processing) of repeatedly performing writing processing without further shifting the position, at the position having been shifted is also combinedly executed. The position shifting is performed only in the x direction, only in the y direction, or in both the x and y directions.

FIG. 24 shows an example of a writing pass table in the case of multi-pass writing, where position shifting is performed only in the y direction according to the second embodiment. In the case of FIG. 24, after performing writing processing (the second writing processing) four times at the same position, the position is shifted to next position to perform the same writing processing. Here, the case of writing processing (the first writing processing) while shifting the position four times is described. That is, writing is performed at the writing pass numbers 1 to 4 while keeping the same positional relationship, at the writing pass numbers 5 to 8 while keeping the same positional relationship, at the writing pass numbers 9 to 12 while keeping the same positional relationship, and at the writing pass numbers 13 to 16 while keeping the same positional relationship. Moreover, in the example of FIG. 24, since the position shifting is performed four times, the position is shifted in the y direction by ¼ of the stripe region width W each time. Therefore, with respect to the writing pass numbers 1 to 4, writing is performed at the position whose stripe shifting amount in the y direction is 0. With respect to the writing pass numbers 5 to 8, writing is performed at the position whose stripe shifting amount in the y direction is W/4. With respect to the writing pass numbers 9 to 12, writing is performed at the position whose stripe shifting amount in the y direction is W/2. With respect to the writing pass numbers 13 to 16, writing is performed at the position whose stripe shifting amount in the y direction is 3W/4.

Since the deflection region shifts when the position shifting is performed, the beam which beam irradiates the same position is changed. The changed beam may be projected on a position shifted from the beam position before the changing, due to distortion etc. of the electron optics system. Therefore, when the position is shifted, it is not preferable to divide a beam irradiation for the total irradiation time into a series of irradiation steps. Then, according to the second embodiment, the exposure steps 1 to 6 shown in FIG. 15 are executed at the writing pass numbers 1 to 4. Specifically, the exposure step 1 is performed at the writing pass number 1. The exposure step 2 is performed at the writing pass number 2. The exposure steps 3 and 4 are performed at the writing pass number 3. The exposure steps 5 and 6 are performed at the writing pass number 4. Similarly, the exposure steps 1 to 6 shown in FIG. 15 are performed at the writing pass numbers 5 to 8. Specifically, the exposure step 1 is performed at the writing pass number 5. The exposure step 2 is performed at the writing pass number 6. The exposure steps 3 and 4 are performed at the writing pass number 7. The exposure steps 5 and 6 are performed at the writing pass number 8. Similarly, the exposure steps 1 to 6 shown in FIG. 15 are performed at the writing pass numbers 9 to 12. Specifically, the exposure step 1 is performed at the writing pass number 9. The exposure step 2 is performed at the writing pass number 10. The exposure steps 3 and 4 are performed at the writing pass number 11. The exposure steps 5 and 6 are performed at the writing pass number 12. Similarly, the exposure steps 1 to 6 shown in FIG. 15 are performed at the writing pass numbers 13 to 16. Specifically, the exposure step 1 is performed at the writing pass number 13. The exposure step 2 is performed at the writing pass number 14. The exposure steps 3 and 4 are performed at the writing pass number 15. The exposure steps 5 and 6 are performed at the writing pass number 16.

Here, similarly to the comparative example explained in FIG. 10, when performing grouping by dividing the irradiation time of each pass of the writing pass numbers 1 to 16 shown in FIG. 24 into "n" irradiation steps, "n" irradiation steps of the exposure steps 1 to 5 are performed for each pass of the writing pass numbers 1 to 16 each time. Therefore, the number of irradiation steps and the amount of data transmission of each irradiation step in accordance with the number of irradiation steps are increased according to the number of passes. On the other hand, according to the second embodiment, as shown in FIG. 24, the writing pass numbers 1 to 16 are respectively collected based on positions to be the same position, and grouping is performed by dividing the total of writing time of repeatedly performing writing processing at the same position into "n" or (n+a) irradiation steps, thereby reducing the number of irradiation steps and the amount of data transmission of each irradiation step in accordance with the number of irradiation steps.

Therefore, according to the second embodiment, using multiple beams, when performing multi-pass writing by combining a plurality of writing processing (the first writing processing) of repeatedly writing while shifting the position of a beam deflection region, and a plurality of writing processing (the second writing processing) of writing without shifting the position of a beam deflection region for each of the plurality of writing processing (the first writing processing), an irradiation time which is used as a dividing target is obtained by dividing the total irradiation time of all the number of times of writing (the writing pass numbers 1 to 16) of corresponding beams which irradiate the same position of the target object 101 by the number of times (e.g., four times in the example of FIG. 24) of the plurality of writing processing (the first writing processing).

First, in the pattern area density calculation step (S102), the writing region of the target object 101 or the chip region to be written is divided into a plurality of stripe regions at the positions shown by the writing pass numbers 1 to 4 of FIG. 24. In other words, a stripe layer is generated such that the shifting amount of the stripe region is 0. Then, each stripe region is virtually divided into a plurality of mesh regions described above. The area density calculation unit 60 reads, for each stripe region, corresponding writing data from the storage device 140, and assigns a plurality of figure patterns defined in the writing data to mesh regions. Then, the area density of a figure pattern arranged for each mesh region should be calculated.

In the total shot time (the total irradiation time) T calculation step (S104), the irradiation time calculation unit 62 calculates, for each mesh region of a predetermined size, an irradiation time T (hereinafter, also called a shot time or an exposure time) by dividing a total irradiation time of all the passes (all the number of times of writing: writing pass numbers 1 to 16 of FIG. 24) of corresponding beams which irradiate the same position of the target object 101 when performing multi-pass writing using multiple beams of an electron beam by the number of times of position shifting in the writing processing (the first writing processing).

In the gray scale value N calculation step (S106), the gray scale value calculation unit 64 calculates a gray scale value N, being an integer, used when defining the irradiation time T of each mesh region defined in a total irradiation time map by using a predetermined quantization unit A. By this processing, the gray scale value N in the case of repeatedly performing writing processing without shifting the position is calculated.

In the conversion to binary number step (S108), the bit conversion unit 66 converts, for each shot position, the gray scale value N, which is obtained dividing the irradiation time T by the quantization unit A, wherein the irradiation time T is calculated by dividing the total irradiation time of all the number of times of writing by the number of times of position shifting in the writing processing (the first writing processing), to a binary number of a preset number of digits.

Then, similarly to the first embodiment, with respect to the writing processing represented by the writing pass numbers 1 to 4 of FIG. 24 in which no position shifting is performed, each step from the irradiation time arrangement data processing step (S109) to the writing pass change step (S122) of FIG. 7 is executed.

In the determination step (S124), the writing control unit 72 determines whether all position shifting writing processing (the first writing processing) has been completed. If the all position shifting writing processing (the first writing processing) has been completed, it ends. If the all position shifting writing processing (the first writing processing) has not been completed yet, it returns to the pattern area density calculation step (S102) and repeats from the pattern area density calculation step (S102) to the determination step (S124) until the all position shifting writing processing (the first writing processing) is completed.

After writing of the writing pass numbers 1 to 4 of FIG. 24 has been finished, when it returns to the pattern area density calculation step (S102), the writing region of the target object 101 or the chip region to be written is divided into a plurality of stripe regions at the positions shown by the writing pass numbers 5 to 8 of FIG. 24. In other words, a stripe layer is generated such that the shifting amount of the stripe region is W/4. Then, each stripe region whose position has been shifted by W/4 is virtually divided into plurality of mesh regions described above. The area density calculation unit 60 reads corresponding writing data from the storage device 140, for each stripe region, for example, and assigns a plurality of figure patterns defined in the writing data to a mesh region. Then, the area density of a figure pattern arranged for each mesh region should be calculated. Similarly, after writing of the writing pass numbers 5 to 8 of FIG. 24 has been finished, when it returns to the pattern area density calculation step (S102), the writing region of the target object 101 or the chip region to be written is divided into a plurality of stripe regions at the positions shown by the writing pass numbers 9 to 12 of FIG. 24. In other words, a stripe layer is generated such that the shifting amount of the stripe region is W/2. Similarly, after writing of the writing pass numbers 9 to 12 of FIG. 24 has been finished, when it returns to the pattern area density calculation step (S102), the writing region of the target object 101 or the chip region to be written is divided into a plurality of stripe regions at the positions shown by the writing pass numbers 13 to 16 of FIG. 24. In other words, a stripe layer is generated such that the shifting amount of the stripe region is 3W/4.

As described above, according to the second embodiment, for each writing processing (the first writing processing), each irradiation step is obtained by dividing the entire irradiation steps of a plurality of writing processing (second writing processing) of the beam concerned into "n" irradiation steps, "n" being the digit number, which is obtained by multiplying a gray scale value N by a quantization unit, wherein the gray scale value is one of gray scale values defined in decimal numbers converted from each digit value of a n-digit binary number, or each irradiation step is obtained by further dividing a part of the "n" irradiation steps in order to obtain a plurality (n+a), being greater than "n", of irradiation steps. Then, regarding the above each set of irradiation steps as a set of irradiation steps of one of a plurality of writing processing (the second writing processing), irradiation of beams of irradiation time periods of each set irradiation steps corresponding to the writing processing concerned is applied to the target object 101, for each writing processing (the first writing processing) of a plurality of writing processing (the first writing processing) of multi-pass writing, and for each writing processing (the second writing processing) of a plurality of writing processing (the second writing processing).

FIG. 25 shows another example of a writing pass table in the case of multi-pass writing, where position shifting is performed only in the y direction according to the second embodiment. In the case of FIG. 25, after performing writing processing (the second writing processing) four times at the same position, the position is shifted to next position to perform the same writing processing. Here, the case of writing processing (the first writing processing) while shifting the position four times is described. Moreover, in the example of FIG. 25, since the position shifting is performed four times, the position is shifted in the y direction by ¼ of the stripe region width W each time. Further, the position is shifted by ½ of the beam size "a" in the y direction, in the x direction, and in both the x and y directions. Therefore, with respect to the writing pass numbers 1 to 4, writing is performed at the position whose stripe shifting amount in the y direction is 0. With respect to the writing pass numbers 5 to 8, writing is performed at the position whose stripe shifting amount in the y direction is W/4+a/2. With respect to the writing pass numbers 9 to 12, writing is performed at the position whose stripe shifting amount in the x direction is a/2, and stripe shifting amount in the y direction is W/2. With respect to the writing pass numbers 13 to 16, writing is performed at the position whose stripe shifting amount in the x direction is a/2, and stripe shifting amount in the y direction is 3W/4+a/2. Other points are the same as those in FIG. 24. Shifting by half the beam size "a" has an effect of improving the precision of the position and the dimension of a writing pattern as disclosed in JP-A-6-302506, for example. Generally, a dose of beam whose position is shifted from reference position by a/2 is different. Therefore, also regarding shifting by a/2, it is necessary to complete all the exposures in the bit processing table by a series of exposures without any shifting.

According to the second embodiment, as described above, even when performing multi-pass writing in which the position of a deflection region is shifted, the amount of data transmission and the number of irradiation steps can be reduced as well as the first embodiment. Consequently, the throughput can be improved in the whole writing processing.

Third Embodiment

Although, in each embodiment described above, blanking control is performed for each of a plurality of irradiation steps made by dividing shots of all the passes in multi-pass writing where no position shifting is performed, for each beam, by using the blanking plate 204 for individual blanking control and the deflector 212 for common blanking, it is not limited thereto. In the third embodiment, there will be described a configuration in which blanking control is performed for each of a plurality of irradiation steps made by dividing shots of all the passes in multi-pass writing where no position shifting is performed, by using the blanking plate 204 for individual blanking control without using the deflector 212 for common blanking.

Figure 26:
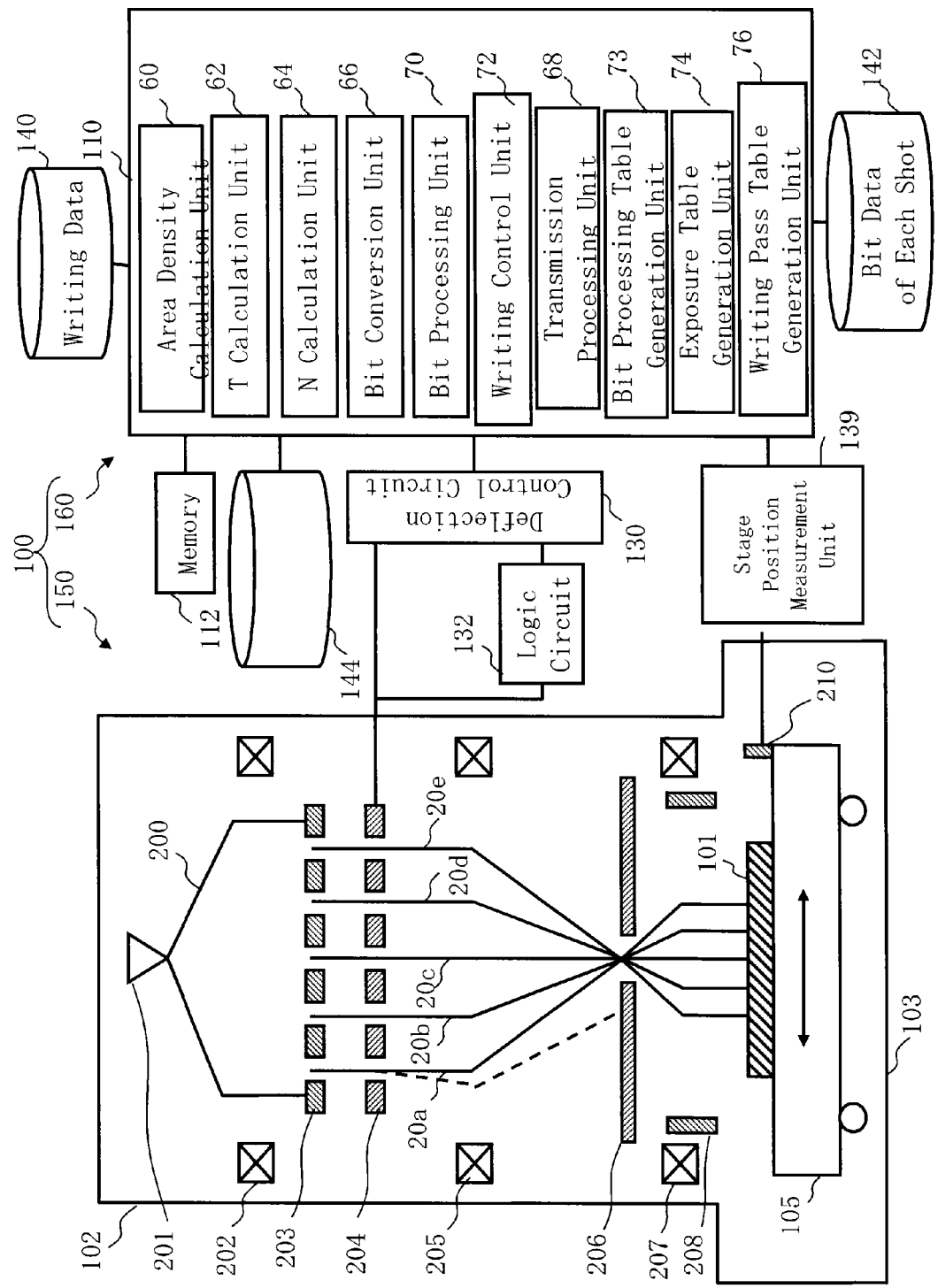
FIG. 26 is a schematic diagram showing the structure of a writing apparatus according to the third embodiment.

FIG. 26 is a schematic diagram showing the structure of a writing apparatus according to the third embodiment. FIG. 26 is the same as FIG. 1 except that the deflector 212 does not exist and output of the logic circuit 132 is connected to the blanking plate 204. Main steps of a writing method according to the third embodiment are the same as those of FIG. 7. The content of the third embodiment are the same as those of the first embodiment except what is particularly described below.

Figure 27:
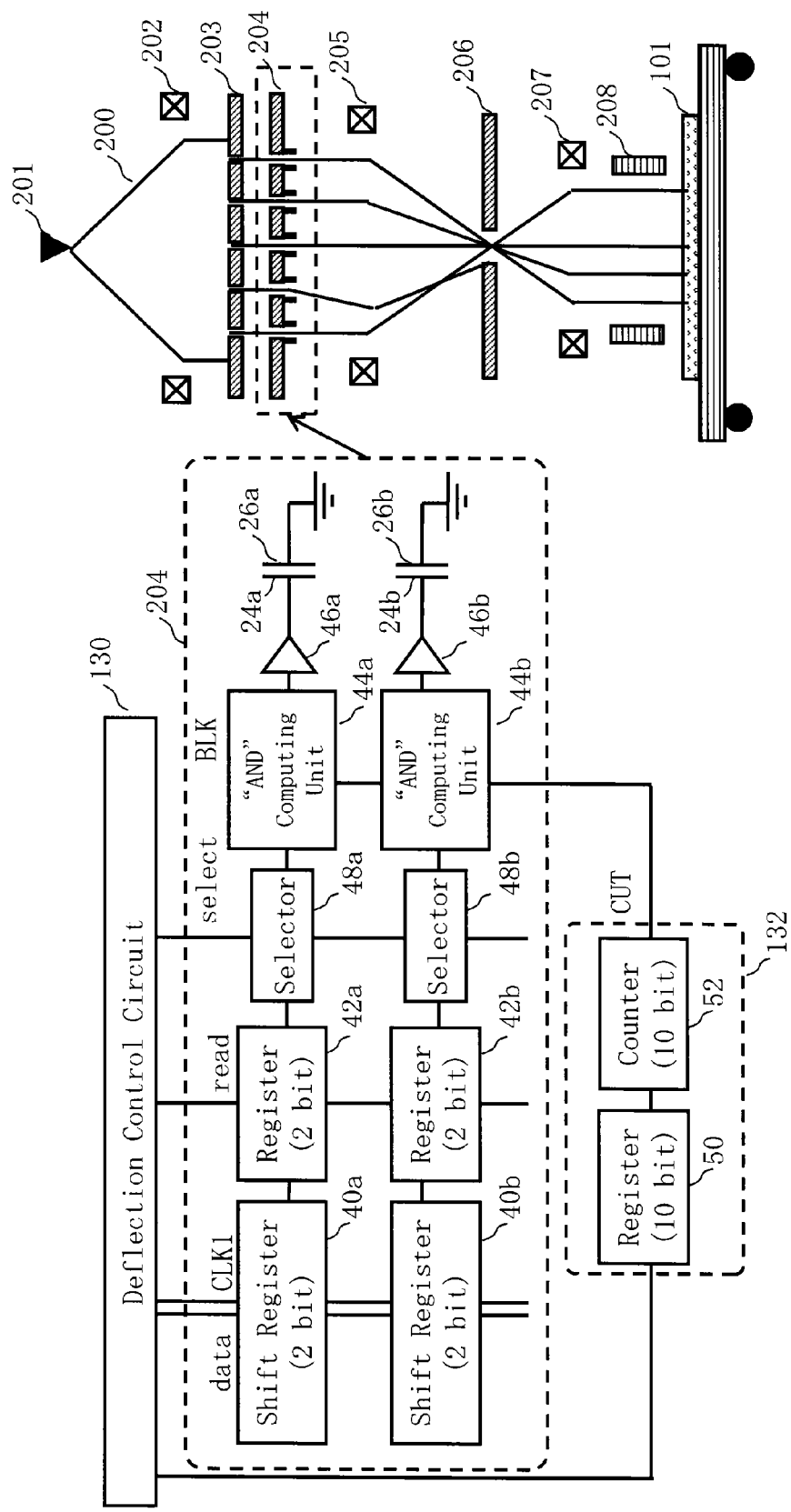
FIG. 27 is a schematic diagram showing the internal structure of an individual blanking control circuit and a common blanking control circuit according to the third embodiment.

FIG. 27 is a schematic diagram showing the internal structure of an individual blanking control circuit and a common blanking control circuit according to the third embodiment. The content of FIG. 27 is the same as that of FIG. 5 except that the deflector 212 does not exist and an output signal of the logic circuit 132 is input into the AND computing unit 44 (AND circuit) instead of a signal from the deflection control circuit 130.

In the individual beam ON/OFF switching step (S116), an ON/OFF control signal (the first ON/OFF control signal) for a beam is output by the logic circuit (the first logic circuit) of the beam concerned, for each beam, with respect to each irradiation of a plurality of times of irradiation, by using a plurality of logic circuits (the first logic circuit) each including the shift register 40 and the individual register 42 each respectively outputting a beam ON/OFF control signal to a corresponding beam in multiple beams. Specifically, as described above, when inputting 2-bit data of the k-th group, the individual register 42 of each beam outputs an ON/OFF signal to the AND computing unit 44 through the selector 48 based on the input data. If the data of the k-th group is "11", two ON signals are to be output, and if the data is "00", two OFF signals are to be output.

In the common beam ON/OFF switching step (S118), for each beam, with respect to each irradiation of a plurality of times of irradiation, after a beam ON/OFF control signal has been switched by the logic circuit for individual blanking, a beam ON/OFF control signal (the second ON/OFF control signal) is output so that a beam may be in the ON state during the irradiation time corresponding to the irradiation concerned, by using the logic circuit 132 (the second logic circuit) which collectively outputs a beam ON/OFF control signal to the whole of multiple beams. Specifically, in the logic circuit 132 for common blanking, ON/OFF is switched depending upon 10-bit timing data of each irradiation step. The logic circuit 132 outputs an ON/OFF control signal to the AND computing unit 44. In the logic circuit 132, an ON signal is output during the irradiation time of each irradiation step.

In the blanking control step, the AND computing unit 44 performs blanking control so that a beam concerned may be in the ON state during the irradiation time corresponding to the irradiation concerned, when both the ON/OFF control signal for an individual beam and the ON/OFF control signal for a common beam are ON control signals. When both the ON/OFF control signal for an individual beam and the ON/OFF control signal for a common beam are ON control signals, the AND computing units 44 outputs an ON signal to the amplifier 46, and, then, the amplifier 46 applies an ON voltage to the electrode 24 of the individual blanking deflector. In other case, the AND computing unit 44 outputs an OFF signal to the amplifier 46, and, then, the amplifier 46 applies an OFF voltage to the electrode 24 of the individual blanking deflector. Thus, when both the ON/OFF control signal for an individual beam and the ON/OFF control signal for a common beam are ON control signals, the electrode 24 (an individual blanking system) of the individual blanking deflector individually performs beam ON/OFF control so that the beam concerned may be in the ON state during the irradiation time corresponding to the irradiation concerned.

As described above, even when the blanking plate 204 for individual blanking control is used without using the deflector 212 for common blanking, the amount of data transmission and the number of irradiation steps can be reduced as well as the first embodiment. Consequently, the throughput can be improved in the whole writing processing. Furthermore, there is an advantage that the deflector 212 for common blanking can be omitted.

Fourth Embodiment

In each embodiment described above, each logic circuit 41 for individual blanking control is arranged on the blanking plate 204, but, however, it may be arranged outside. In the fourth embodiment, the case of arranging each logic circuit 41 for individual blanking control outside the blanking plate 204 will be described. The apparatus structure according to the fourth embodiment is the same as that of FIG. 1 except that each logic circuit 41 for individual blanking control is arranged at the outside of the blanking plate 204. The flowchart showing main steps of a writing method according to the fourth embodiment is the same as that of FIG. 7. The content of the fourth embodiment is the same as that of one of the first to third embodiments except what is particularly described below.

Figure 28:
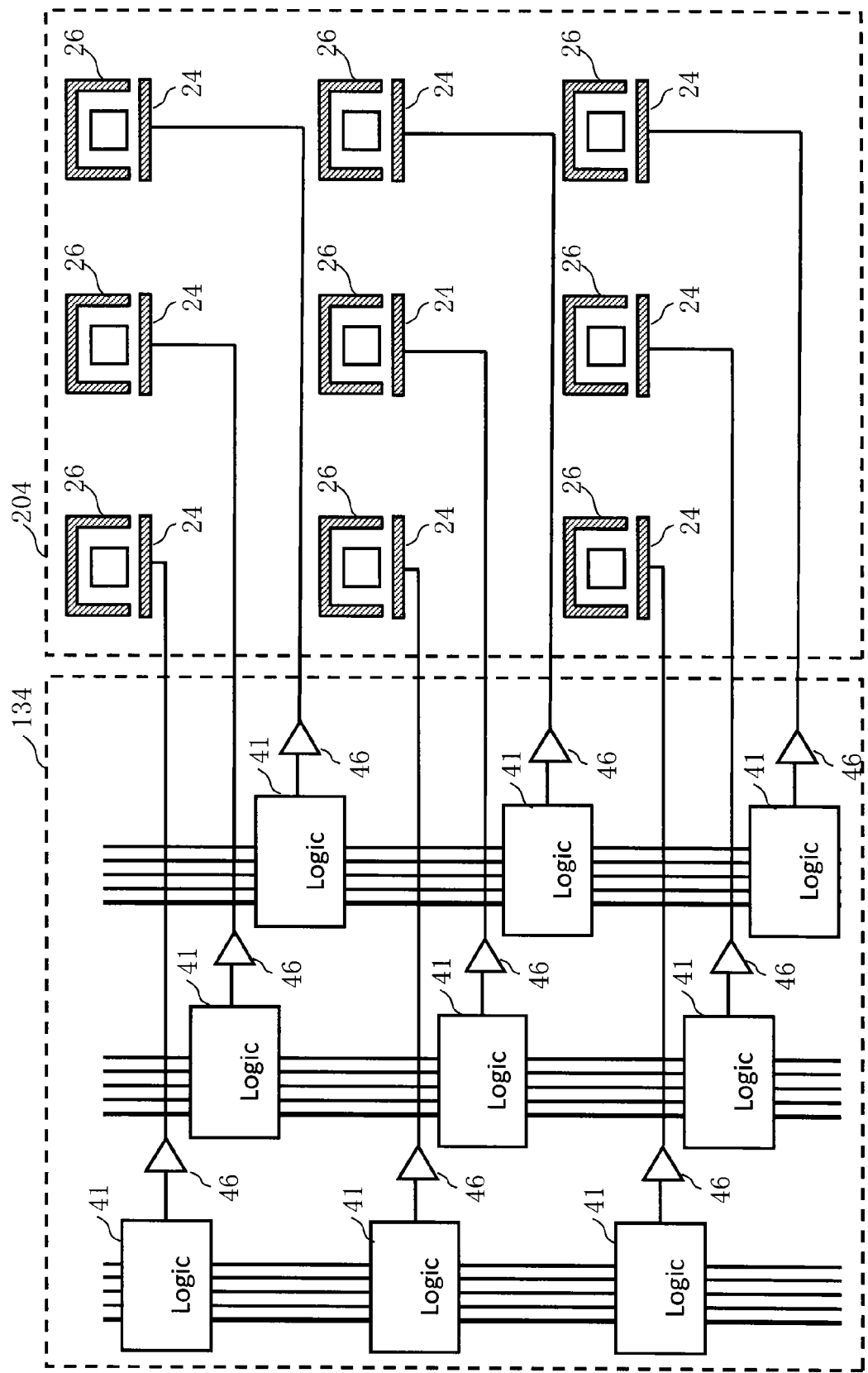
FIG. 28 is a schematic diagram explaining the arrangement state between the logic circuit and the blanking plate 204 according to the fourth embodiment.

FIG. 28 is a schematic diagram explaining the arrangement state between the logic circuit and the blanking plate 204 according to the fourth embodiment. In the fourth embodiment, each logic circuit 41 for individual blanking control and each amplifier 46 are arranged in the logic circuit 134 arranged outside the writing unit 150, and connected to each electrode 24 for individual blanking control by wiring. In such a structure, since the wiring becomes long, crosstalk and settling time increase. However, as described above, according to the fourth embodiment, since ON/OFF switching is performed by the common blanking system after having performed ON/OFF switching by the individual blanking system and having waited for voltage stability, the irradiation time can be controlled highly accurately without being affected by crosstalk and settling time even if they increase.

Embodiments have been explained referring to concrete examples described above. However, the present invention is not limited to these specific examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and multi charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing method comprising:
    forming multiple charged particle beams from a charged particle beam;
    obtaining a first gray scale value by dividing a total irradiation time of the multiple charged particle beams that irradiate a same position of a target object by a quantization unit when performing multi-pass writing using the multiple charged particle beams;
    converting the first gray scale value into a binary number having a predetermined number of digits;
    setting a number of irradiation steps equal to the predetermined number of digits;
    converting each digit of the binary number into an irradiation step duration value for a corresponding one of the irradiation steps, each irradiation step duration value obtained by multiplying a corresponding digit of the binary number by the quantization unit and by a decimal number corresponding to the digit position in the binary number; and
    irradiating the target object with the number of irradiation steps equal to the predetermined number of digits, where the target object is irradiated by the multiple charged particle beams that irradiate the same position of the target object for the irradiation step duration value for each corresponding irradiation step.

2. The method according to claim 1, wherein each pass in the multi-pass writing using the multiple charged particle beams may include one or more irradiation steps.

3. The method according to claim 1, wherein the irradiation steps are grouped and allotted, by unit of group, to the plurality of writing processing.

4. The method according to claim 1, further comprising:
    setting an initial value for each of a number "a" being a number of irradiation time periods of irradiation steps to be increased from digit number "n" of plurality of irradiation steps of first irradiation time periods, and a pass number N being a number of passes in multi-pass writing; and
    calculating a reference irradiation time T' by solving an equation (3), using the digit number "n", the pass number N, and a quantization unit Δ

$$T' = \frac{(2^n - 1)}{N}\Delta. \quad (3)$$

5. The method according to claim 4, further comprising:
    determining whether the reference irradiation time T' calculated satisfies an equation (4), by using the number "a", an irradiation time Ti being an irradiation time of an i-th digit of the binary number, in the first irradiation time periods of the digit number "n" of plurality of irradiation steps, and number "b" being a number of second irradiation time periods to be divided as a part of the first irradiation time periods of the digit number "n" of plurality of irradiation steps $$T' > \frac{\sum_{i}^{Ti>T'} Ti}{a+b}. \quad (4)$$

6. The method according to claim 5, further comprising:
    changing the number "a" when the reference irradiation time T' calculated does not satisfy the equation (4); and
    determining again whether the reference irradiation time T' calculated satisfies the equation (4).

7. The method according to claim 5, wherein irradiation steps of the second irradiation time periods each of which exceeds the reference irradiation time T' in the first irradiation time periods of the predetermined digit number irradiation steps are divided.

8. A multi charged particle beam writing apparatus comprising:
    a stage configured to mount a target object thereon and to be continuously movable;
    an emission unit configured to emit a charged particle beam;
    an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;
    a plurality of blankers configured to respectively perform blanking deflection of a corresponding beam in the multiple beams having passed through the plurality of openings of the aperture member;
    a blanking aperture member configured to block each beam having been deflected to be in a beam-off state by the plurality of blankers;
    a gray scale value obtaining unit configured to obtain a first gray scale value by dividing a total irradiation time of the multiple charged particle beams that irradiate a same position of the target object by a quantization unit when performing multi-pass writing using the multiple charged particle beams;
    a conversion unit configured to convert the first gray scale value into a binary number having a predetermined number of digits, setting a number of irradiation steps equal to the predetermined number of digits, and converting each digit of the binary number into an irradiation step duration value for a corresponding one of the irradiation steps, each irradiation step duration value obtained by multiplying a corresponding digit of the binary number by the quantization unit and by a decimal number corresponding to the digit position in the binary number; and a deflection control unit configured to control a corresponding blanker of the plurality of blankers so that the target object is irradiated with the multiple beams according to the irradiation step values of each corresponding irradiation step.

* * * * *